United States Patent
Yamamoto et al.

(10) Patent No.: US 10,128,735 B2
(45) Date of Patent: Nov. 13, 2018

(54) CONTROL CIRCUIT FOR SEMICONDUCTOR SWITCHING ELEMENT, AND SEMICONDUCTOR DEVICE

(71) Applicant: Mitsubishi Electric Corporation, Tokyo (JP)

(72) Inventors: Koji Yamamoto, Tokyo (JP); Atsunobu Kawamoto, Tokyo (JP); Shinsuke Godo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/561,077

(22) PCT Filed: Aug. 26, 2015

(86) PCT No.: PCT/JP2015/073981
§ 371 (c)(1),
(2) Date: Sep. 25, 2017

(87) PCT Pub. No.: WO2017/033304
PCT Pub. Date: Mar. 2, 2017

(65) Prior Publication Data
US 2018/0062499 A1   Mar. 1, 2018

(51) Int. Cl.
| H01T 15/00 | (2006.01) |
| H02M 1/08 | (2006.01) |
| F02P 3/055 | (2006.01) |
| F02P 3/04 | (2006.01) |
| G05F 1/56 | (2006.01) |
| F02P 3/05 | (2006.01) |
| H03K 17/082 | (2006.01) |
| H03K 17/08 | (2006.01) |

(52) U.S. Cl.
CPC ............ *H02M 1/08* (2013.01); *F02P 3/0435* (2013.01); *F02P 3/053* (2013.01); *F02P 3/055* (2013.01);
(Continued)

(58) Field of Classification Search
CPC ....... H02N 1/08; F02P 3/02; F02P 3/04; F02P 3/0407; F02P 3/0435; G05F 1/10;
(Continued)

(56) References Cited

U.S. PATENT DOCUMENTS

| 7,095,182 B2* | 8/2006 | Ando ...................... F02P 3/051 123/630 |
| 8,861,175 B2* | 10/2014 | Godo ...................... F23Q 3/004 361/263 |

(Continued)

FOREIGN PATENT DOCUMENTS

| JP | 2005-098143 A | 4/2005 |
| JP | 2008-248777 A | 10/2008 |

(Continued)

OTHER PUBLICATIONS

International Search Report issued in PCT/JP2015/073981; dated Dec. 1, 2015.
(Continued)

*Primary Examiner* — Jason M Crawford
(74) *Attorney, Agent, or Firm* — Studebaker & Brackett PC

(57) ABSTRACT

A control circuit for a semiconductor switching element includes a control terminal, a main electrode terminal, and a current sensing terminal, and controls the semiconductor switching element including a diode connected to the main electrode terminal or the current sensing terminal. The control circuit includes an overheat detection circuit, a current detection circuit, and an interruption circuit. The overheat detection circuit outputs an overheat detection signal when a temperature detected based on an output of the diode is equal to or higher than a predetermined set temperature. The current detection circuit outputs a current detection signal when an output value of the current sensing terminal is equal to or greater than a predetermined set
(Continued)

current value. The interruption circuit turns off the semiconductor switching element when both the overheat detection signal from the overheat detection circuit and the current detection signal from the current detection circuit are input.

13 Claims, 19 Drawing Sheets

(52) U.S. Cl.
CPC ............. *G05F 1/561* (2013.01); *H01T 15/00* (2013.01); *H03K 17/0828* (2013.01); *F02P 3/0554* (2013.01); *H03K 2017/0806* (2013.01); *H03K 2217/0027* (2013.01)

(58) Field of Classification Search
CPC ... G05F 1/46; G05F 1/56; G05F 1/561; H01T 15/00
See application file for complete search history.

(56) References Cited

U.S. PATENT DOCUMENTS

| | | | | |
|---|---|---|---|---|
| 2001/0037801 A1* | 11/2001 | Ito | ............................ | F02P 3/04 123/644 |
| 2004/0011342 A1* | 1/2004 | Fukatsu | ................ | F02P 3/0435 123/630 |
| 2004/0200463 A1* | 10/2004 | Ando | .................... | F02P 3/0435 123/630 |
| 2011/0134581 A1* | 6/2011 | Godo | .................... | F02P 3/0554 361/263 |
| 2014/0092655 A1 | 4/2014 | Igarashi et al. | | |
| 2015/0381170 A1* | 12/2015 | Yamamoto | .............. | F02P 3/055 327/109 |
| 2016/0047352 A1* | 2/2016 | Nakayama | ............ | F02P 3/0453 123/406.19 |

FOREIGN PATENT DOCUMENTS

| | | |
|---|---|---|
| JP | 2009-275629 A | 11/2009 |
| JP | 2011-124269 A | 6/2011 |
| WO | 2012/077187 A1 | 6/2012 |

OTHER PUBLICATIONS

International Preliminary Report on Patentability issued in PCT/JP2015/073981; dated Mar. 8, 2018.

An Office Action mailed by the Japanese Patent Office dated Sep. 11, 2018, which corresponds to Japanese Patent Application No. 2017-536129 and is related to U.S. Appl. No. 15/561,077; with English Translation.

* cited by examiner

316 CURRENT LIMITING ATTENUATION START TEMPERATURE DETECTION CIRCUIT

CONTROL CIRCUIT FOR SEMICONDUCTOR SWITCHING ELEMENT, AND SEMICONDUCTOR DEVICE

FIELD

The present invention relates to a control circuit for a semiconductor switching element, and a semiconductor device.

BACKGROUND

For example, as disclosed in JP 2011-124269 A, an ignitor semiconductor device for controlling a semiconductor switching element to be turned on or off to ignite a spark plug of an internal combustion engine is conventionally known. In the device disclosed in JP 2011-124269 A, the temperature of the semiconductor switching element is detected using a current signal obtained through a diode by utilizing temperature characteristic of the diode, which is used for overheat protection.

CITATION LIST

Patent Literature

[PTL 1] JP 2011-124269 A
[PTL 2] WO 2012/077187

SUMMARY

Technical Problem

An ignition system for an internal combustion engine, such as a vehicle engine, includes an ignition coil (induction load; hereinafter referred to also as "L load") for generating a high voltage to be applied to the spark plug. When the temperature of the semiconductor switching element is detected based on an electrical signal obtained through a diode, a displacement current (so-called L load noise) is generated in the diode in association with the turning-on operation of the semiconductor switching element due to the presence of the induction load. This L load noise may cause erroneous temperature detection, which causes a problem that an unnecessary overheat protection is performed in association with the temperature erroneous detection.

The present invention has been made to solve the above-mentioned problem, and an object of the present invention is to provide a control circuit for a semiconductor switching element and a semiconductor device which prevent unnecessary overheat protection due to erroneous temperature detection of a temperature from being performed.

Solution to Problem

A control circuit for a semiconductor switching element according to one aspect of the present invention, the control circuit including a control terminal, a main electrode terminal, and a current sensing terminal and being configured to control the semiconductor switching element including a diode connected to the main electrode terminal or the current sensing terminal, the control circuit includes:

an overheat detection circuit configured to generate an overheat detection signal when a temperature detected based on an output of the diode is equal to or higher than a predetermined set temperature;

a current detection circuit configured to generate a current detection signal when an output value of the current sensing terminal is equal to or greater than a predetermined set current value; and an interruption circuit configured to turn off the semiconductor switching element when both the overheat detection signal from the overheat detection circuit and the current detection signal from the current detection circuit are input.

A semiconductor device according to another aspect of the present invention that controls a current caused to flow through an induction load to energize an ignition plug of an internal combustion engine, the semiconductor device includes:

a semiconductor switching element including a main electrode terminal and a current sensing terminal, the main electrode terminal being connected to the induction load;

a diode connected to the main electrode terminal or the current sensing terminal;

an overheat detection circuit configured to output an overheat detection signal when a temperature detected based on an output of the diode is equal to or higher than a predetermined set temperature;

a current detection circuit configured to output a current detection signal when an output value of the current sensing terminal is equal to or greater than a predetermined set current value; and an interruption circuit configured to turn off the semiconductor switching element when both the overheat detection signal from the overheat detection circuit and the current detection signal from the current detection circuit are input.

Advantageous Effects of Invention

According to the present invention, a determination as to whether or not overheat protection is necessary is made based on both an overheat detection signal and a current detection signal. Accordingly, it is possible to turn off the semiconductor switching element only when a certain amount of load current is flowing to the semiconductor switching element and the semiconductor switching element is determined to have reached an abnormal temperature. As a result, even if the overheat detection signal is output by mistake, an unnecessary overheat protection can be prevented from being performed.

BRIEF DESCRIPTION FOR DRAWINGS

DESCRIPTION OF EMBODIMENTS

Conventional Problems with Ignition System

Figure 1:
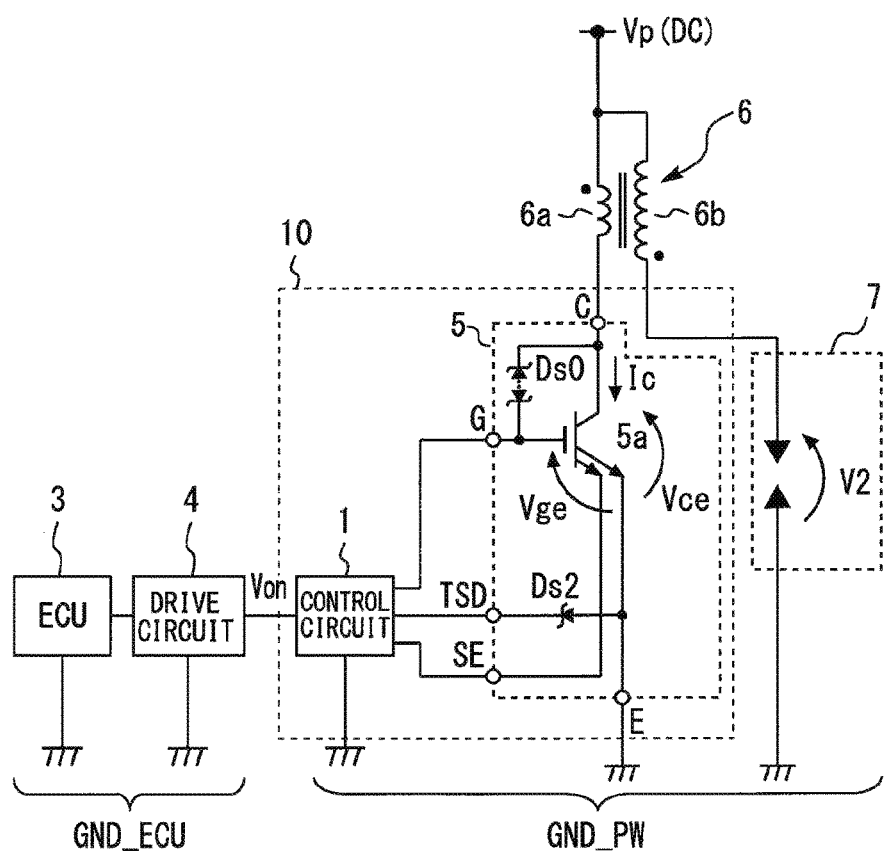
FIG. 1 is a diagram illustrating an ignitor semiconductor device according to the first embodiment of the present invention.

The following embodiments relate to a method and a circuit mode for preventing shortening of the life of a semiconductor switching element (hereinafter also referred to simply as a "switching element") when a switching element that drives an induction load in an ignition system for an internal combustion engine has reached an abnormal temperature.

For example, JP 2011-124269 A discloses an ignition system for an internal combustion engine, such as a vehicle engine. JP 2011-124269 A proposes an overheat protection circuit for interrupting a switching element when the switching element causes abnormal heating, so as to prevent shortening of the life of the switching element. However, the overheat protection in the ignition system disclosed in JP 2011-124269 A has the following problems to be solved.

Methods for interrupting or turning off a switching element include so-called soft interruption and hard interruption. The "soft interruption" is an interruption method for gradually reducing a load current to zero, or moderately reducing the current, whereas the "hard interruption" is a method for forcibly interrupting the current flowing to the switching element, or rapidly interrupting the current. In the ignition system, it is preferable to perform the soft interruption to interrupt the switching element when overheat is detected. This is because, if the hard interruption is performed, the load current is interrupted at a timing which is unrelated to an ignition signal timing that is generally scheduled by an engine control computer, and thus it is highly likely that the spark plug is energized at a timing different from a proper engine ignition timing.

In this regard, the ignitor power semiconductor device disclosed in JP 2011-124269 A has a "current limiting function" for limiting the load current to a preliminarily set current limiting value, and uses this "current limiting function" for the purpose of preventing erroneous ignition at an unnecessary timing and self-protection of the switching element. Specifically, the timing of interrupting the load current is matched with the ignition timing that is generally scheduled by the engine control computer, and a current limiting value is reduced depending on the temperature when abnormal heat generation occurs, thereby preventing a Joule loss and suppressing the amount of heat generation. When abnormal heat generation continuously occurs and the temperature continues to rise, the current limiting value is gradually decreased depending on the temperature. Such a method prevents erroneous ignition from occurring at a timing which is different from the originally intended timing and prevents a power loss from occurring during abnormal heat generation, which enables self-protection of the switching element.

However, if the overheat protection is implemented only by the method of reducing the current limiting value, it is possible to take only such measures that the current limiting value is reduced, even when the abnormal heat generation is excessive and there is a need to perform the interruption urgently. Accordingly, there is a possibility that sufficient protection cannot be provided. Therefore, the following embodiments provide an ignitor semiconductor device including an overheat protection device capable of rapidly performing an interruption when an abnormal temperature is detected, by using the temperature characteristic of a reverse saturation current of a diode.

First Embodiment

[Configuration of Device of First Embodiment]

Figure 2:
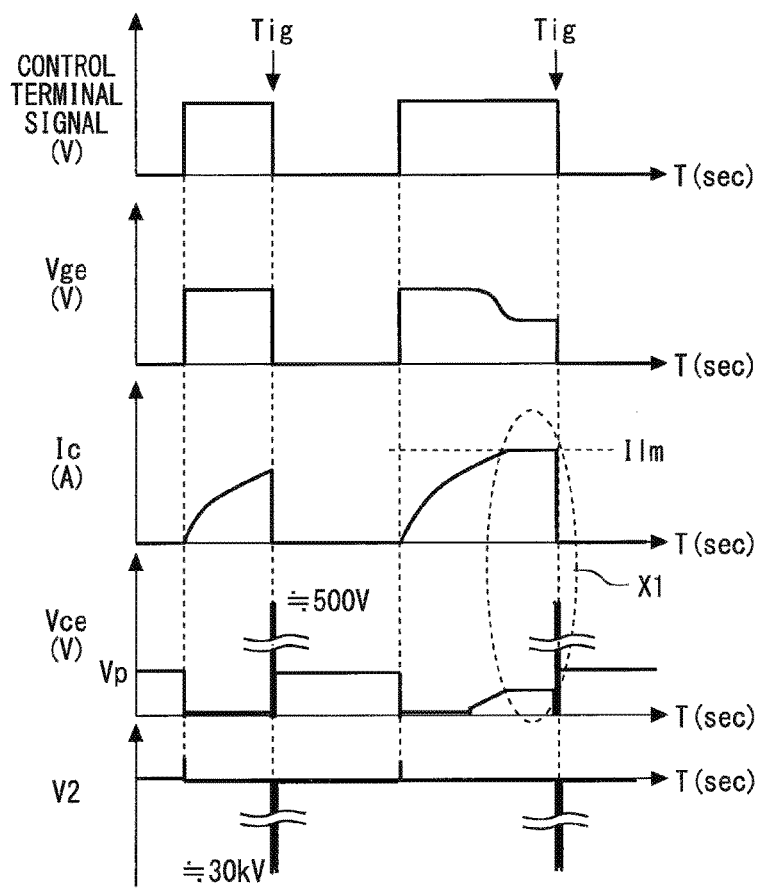
FIG. 2 is a timing diagram illustrating the operation of the ignitor semiconductor device according to the first embodiment of the present invention.

FIG. 1 is a diagram illustrating an ignitor semiconductor device 10 according to the first embodiment of the present invention. FIG. 2 is a timing diagram illustrating the operation of the ignitor semiconductor device 10 according to the first embodiment of the present invention. An ignition system (induced ignition system) for an internal combustion engine, such as a vehicle engine, as illustrated in FIG. 1, includes each component for generating a high voltage to be applied to a spark plug 7. Specifically, this ignition system includes a transformer 6 which is an ignition coil (induction load; hereinafter referred to also as "L load"), the semiconductor device 10, which is a so-called igniter for controlling a current caused to flow through the transformer 6, an electronic control unit (ECU) 3 for engine control including a computer, and a drive circuit 4 which is provided between the ECU 3 and a control circuit 1. The semiconductor device 10 includes a semiconductor switching element 5 (hereinafter also referred to simply as "switching element 5") that is connected to the transformer 6, and the control circuit 1 that controls ON/OFF (i.e., conduction and interruption) of the switching element 5.

The semiconductor device 10 includes the switching element 5 including a gate terminal G, which is a control terminal, a collector terminal C and an emitter terminal E, which are main electrode terminals, a diode Ds2 having an anode connected to the emitter terminal E of the switching element 5, and the control circuit 1 that receives a signal from the drive circuit 4 and controls the switching element 5. The diode Ds2 is a temperature-sensitive diode indicating an output corresponding to a temperature. The control circuit 1 receives a control signal from the ECU 3, which is a control computer, via the drive circuit 4. A drive voltage signal Von is input to the control circuit 1 from the drive circuit 4.

An IGBT (insulated gate bipolar transistor) 5a which is a main component of the switching element 5 and includes, as electrode terminals, not only the general terminals, such as the collector terminal C, the emitter terminal E, and the gate terminal G, but also a current sensing terminal SE through which a small sensing current Isense which is proportional to a collector current Ic flows is employed. A ratio between the collector current Ic and the sensing current Isense is, for example, about 1/1000, and the sensing current Isense is small. As the switching element 5, for example, a switching element including a clamping Zener diode Ds0 and a diode Ds2, as well as the IGBT 5a, is used. The switching element 5 is connected to a primary winding 6a of the transformer 6, and a secondary winding 6b of the transformer 6 is connected to the spark plug 7. In the embodiment, the diode Ds2 is incorporated in the switching element 5, but in a modified example, the diode Ds2 may be externally attached to the switching element 5, or may be incorporated in, for example, the control circuit 1. The switching element 5 may have a configuration in which the IGBT 5a and the diode Ds2, which is a temperature-sensitive element for detecting the temperature of the IGBT 5a, are formed on the same substrate. A Zener diode as illustrated in the circuit diagram may be used as the diode Ds2, or, for example, a Schottky barrier diode may be used. The switching element 5 includes a temperature sensing terminal TSD connected to the cathode of the diode Ds2. A reverse saturation current Is3 of the diode Ds2 flows through the temperature sensing terminal TSD. Based on the reverse saturation current Is3, the temperature of the switching element 5 (specifically, an element temperature Tigbt which is the temperature of the IGBT 5a) is detected.

In the first embodiment, the IGBT is used as a main component of the switching element 5. However, instead of the IGBT, a MOSFET including a current sensing terminal may be used as another modified example. As a semiconductor material, not only silicon, but also wide band gap semiconductor may be used. As the wide band gap semiconductor, a silicon carbide (SiC), a gallium nitride-based material (GaN), or diamond may be used.

The transformer 6 is an ignition coil. In the transformer 6, a power supply Vp, such as a battery, is connected to one end of the primary winding 6a, and a semiconductor device 10 (specifically, the collector terminal C of the switching element 5) is connected to the other end of the primary winding 6a. Similarly, one end of the secondary winding 6b is connected to the power supply Vp, and the spark plug 7 having one end that is grounded is connected to the other end of the secondary winding 6b. The switching element 5 can supply or interrupt a primary-side current for the transformer 6 (ignition coil).

The ECU 3 and the drive circuit 4 are connected to GND_ECU which is a control system ground. On the other hand, the control circuit 1, the switching element 5, and the like are connected to GND_PW which is a power system ground.

A basic operation sequence of the semiconductor device 10 will be described. First, an ON signal from the ECU 3 is transmitted to the control circuit 1 through the drive circuit 4. When the ON signal is input to the control circuit 1, the ON signal is transmitted to the gate terminal G of the IGBT 5a serving as a power semiconductor switching element. When the IGBT 5a is driven, a current flows to the transformer 6, i.e., the induction load (L load). At an ignition timing, an OFF signal is input to the gate terminal G, so that the IGBT 5a is turned off. When the IGBT 5a is interrupted, a collector-emitter voltage Vce rises to about 500 V, which allows a high voltage V2 to be excited in the secondary winding 6b of the transformer 6. As illustrated in the timing diagram of FIG. 2, V2 is generally equal to or higher than −30 kV.

A timing diagram illustrated in FIG. 2 will be described below.

(1) When the ON signal is applied to the gate terminal G, the IGBT 5a is turned on.

(2) The load current Ic as illustrated in FIG. 2 flows in accordance with a time constant which is determined by the inductance and wiring resistance of the L load.

(3) At a timing Tig when it is intended to ignite a fuel, the signal to be supplied to the gate terminal G is turned off.

(4) A gate drive signal to be supplied to the IGBT 5a is also turned off and the load current Ic is interrupted.

(5) The current interruption induces a change in flux linkage within the transformer 6, and also induces a high voltage depending on a winding number ratio on the secondary side. Thus, discharge is generated on the spark plug 7 in an engine cylinder.

A region surrounded by a broken line X1 in FIG. 2 is a region in which the "current limiting function" is activated by the "current limiting circuit 19" which will be described later. In this region X1, a large Joule loss is generated in the switching element 5.

In order to prevent breakdown of transformer winding a clamping Zener diode Ds0 is generally provided between C and G in such a manner that Vce is clamped at about 500 V.

In the semiconductor device 10 illustrated in FIG. 1, the value of the load current Ic varies depending on an ON time of a control signal and a voltage Vp. The semiconductor device 10 is configured to activate the "current limiting function" for limiting the current so that the current is caused to plateau when the load current Ic reaches a certain value or greater. The current limiting function is a protection function for preventing a certain amount or more of the load current Ic from flowing. This function is used to avoid the risk of meltdown of the winding of the transformer 6, or magnetic saturation of the transformer 6. Specifically, according to the current limiting function of the semiconductor device 10, it is possible to prevent the meltdown of winding due to overcurrent, and demagnetization of a magnet for adjusting the reluctance (magnetic reluctance) of the transformer 6, and to prevent magnetic saturation of a core material. A set value for determining a maximum allowable current value in the current limiting function is also referred to as a "current limiting value Ilm". The current limiting value Ilm can be set to a value such as 10 A or 14 A. When the load current Ic of the switching element 5 reaches the current limiting value Ilm and control is performed to prevent a current larger than the current limited value from flowing, the gate voltage of the IGBT 5a is reduced. This corresponds to a negative feedback control by Ic detection.

[Configuration of Control Circuit of First Embodiment]

Figure 3:
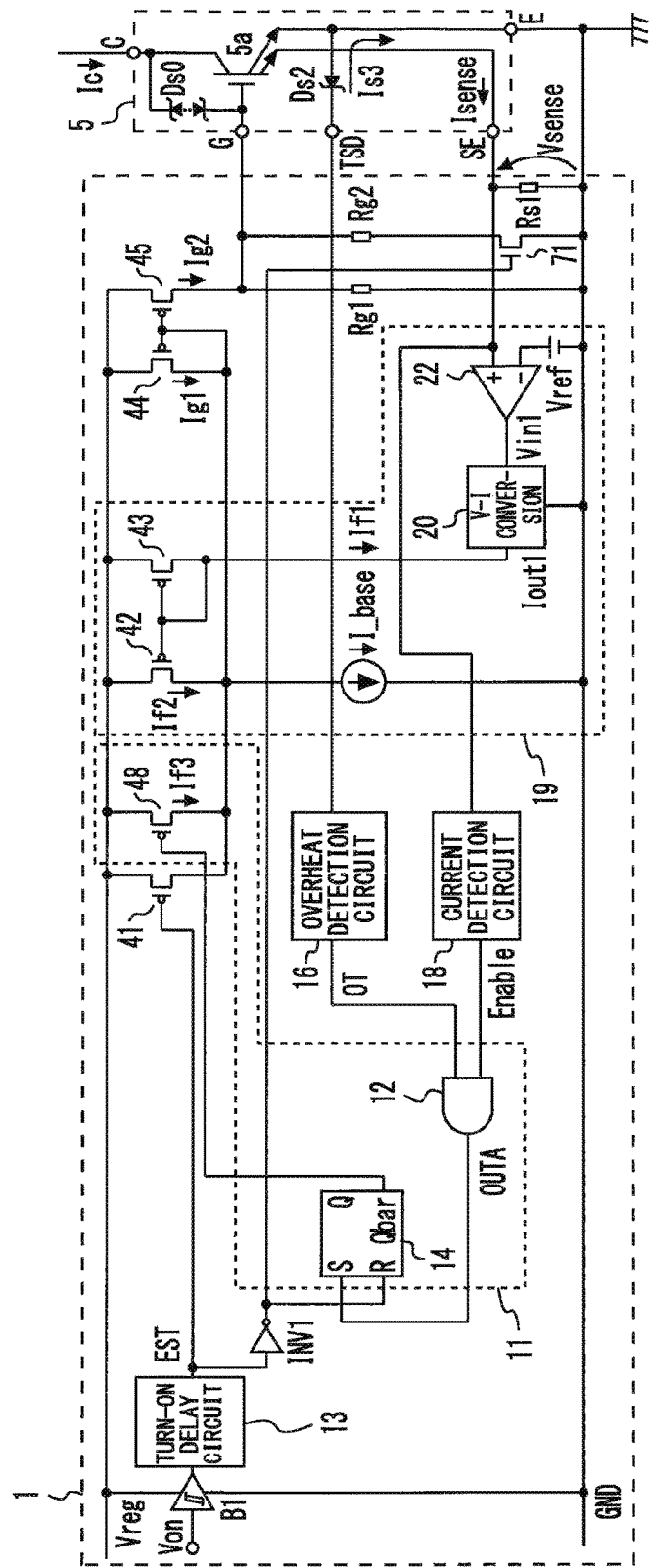
FIG. 3 is a diagram illustrating the control circuit of the switching element according to the first embodiment of the present invention.

FIG. 3 is a diagram illustrating the control circuit 1 of the switching element according to the first embodiment of the present invention. The control circuit 1 includes: a Schmitt trigger circuit B1 that performs waveform shaping of an input signal applied to the ECU 3; a turn-on delay circuit 13 that outputs a control signal EST obtained by adding a predetermined delay to the output of the Schmitt trigger circuit B1; a PMOSFET 41 having a gate that receives the control signal EST; and an inverter INV1 that inverts the control signal EST and outputs the inverted signal to a reset terminal R of the latch circuit 14. Each circuit element in the control circuit 1 is supplied with a control power Vreg and operates using the control power.

The control circuit 1 includes a first current mirror circuit composed of a PMOSFET 44 and a PMOSFET 45, a resistor Rg1, a detection resistor Rs1, and an NMOSFET 71. One end of the resistor Rg1 is connected to a node between the gate terminal G of the IGBT 5a and the PMOSFET 45, and the other end of the resistor Rg1 is connected to a ground. One end of the detection resistor Rs1 is connected to the current sensing terminal SE, and the other end of the detection resistor Rs1 is connected to the emitter terminal E. An output signal from the inverter INV1 is applied to the gate of the NMOSFET 71, and the emitter terminal E and the gate terminal G are connected via a resistor Rg2 when the NMOSFET 71 is electrically connected. The first current mirror circuit generates a first mirror current Ig2 by duplicating a first input current Ig1, and uses the first mirror current Ig2 as a signal input to the gate terminal G of the switching element 5.

The control circuit 1 further includes a current limiting circuit 19, an overheat detection circuit 16, a current detection circuit 18, and an interruption circuit 11. Specifically, the control circuit 1 includes the overheat detection circuit 16 for performing temperature detection based on the diode Ds2. The overheat detection circuit 16 detects the temperature of the switching element 5, and outputs an overheat detection signal OT which depends on the temperature. Specifically, when the temperature detected based on the output of the diode Ds2 is equal to or higher than a predetermined set temperature, the overheat detection circuit 16 outputs the overheat detection signal OT. The control circuit 1 includes the current detection circuit 18. The current detection circuit 18 monitors the load current Ic of the switching element 5, and outputs a signal corresponding to the load current Ic. Specifically, the current detection circuit 18 receives Isense. The current detection circuit 18 detects a current proportional to the load current Ic based on the current Isense, and outputs a current detection signal Enable which depends on the load current Ic flowing to the switching element 5. When the output value of the current sensing terminal SE is equal to or greater than the predetermined "set current value", the current detection circuit 18 outputs the current detection signal Enable.

The anode of the diode Ds2 is connected to the emitter terminal E of the switching element 5, and the cathode of the diode Ds2 is connected to the overheat detection circuit 16 described above. One end of the current detection circuit 18 is connected to a node between the detection resistor Rs1 and the current sensing terminal SE of the switching element 5.

Upon receiving both the overheat detection signal OT from the overheat detection circuit 16 and the current detection signal Enable from the current detection circuit 18, the interruption circuit 11 turns off the switching element 5. Thus, when the load current Ic flowing to the switching element 5 is equal to or greater than a predetermined set current and the temperature detected by the diode Ds2 is equal to or higher than a predetermined set temperature, the interruption circuit 11 interrupts the load current flowing to the switching element 5. Specifically, the interruption circuit 11 reduces the first input current Ig1 to thereby turn off the switching element 5.

The interruption circuit 11 includes an AND circuit 12, a latch circuit 14, and a PMOSFET 48. The AND circuit 12 calculates a logical AND of the overheat detection signal OT and the current detection signal Enable. The latch circuit 14 latches an output value (Qbar) in response to a change in the output from the AND circuit 12. The PMOSFET 48 is a switch element that operates in response to the output value of the latch circuit 14 to thereby reduce the first input current Ig1. More specifically, outputs of the current detection circuit 18 and the overheat detection circuit 16 are input to the AND circuit 12. An output signal OUTA from the AND circuit 12 is input to a set terminal S of the latch circuit 14. The reset terminal R of the latch circuit 14 is connected to an output of the inverter INV1. A Q bar terminal Qbar of the latch circuit 14 is connected to the gate of the PMOSFET 48. When both the overheat detection signal OT and the current detection signal Enable are output, the latch circuit 14 continuously operates the switch element to maintain the switching element 5 in a stopped state. Once overheat is detected by the latch circuit 14, the overheat protection can be continued thereafter until the control signal EST is turned off.

The current limiting circuit 19 includes an amplifier 22, a voltage-to-current conversion circuit 20, a constant current source I_base, and a second current mirror circuit composed of PMOSFETs 42 and 43. The second current mirror circuit duplicates a second input current If1 flowing through the PMOSFET 43 to generate a second mirror current If2 flowing through the PMOSFET 42. The constant current source I_base is connected to a junction between the second mirror current If2 and the first input current Ig1. The current limiting circuit 19 adjusts the second input current If1 based on the voltage of the current sensing terminal SE so that the load current Ic of the switching element 5 is limited to the set current limiting value Ilm. A specific operation will be described later with reference to the related art illustrated in FIG. 14.

The anode of the diode Ds2 is connected to the emitter terminal E, and the cathode of the diode Ds2 is connected to the overheat detection circuit 16. The interruption circuit 11 detects a temperature based on the value of the reverse saturation current Is3 flowing through the cathode of the diode Ds2.

RELATED ART

Figure 14:
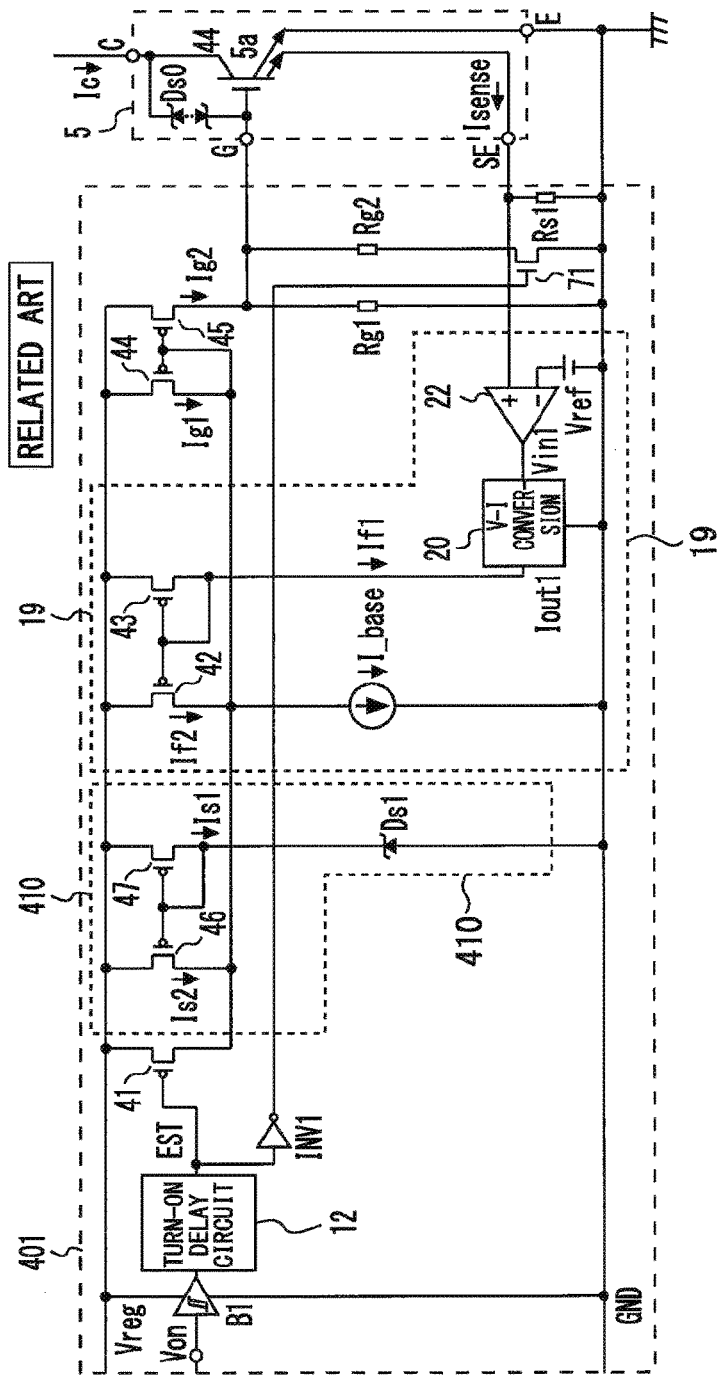
FIG. 14 is a diagram illustrating a control circuit of the switching element according to the related art related to the embodiments of the present invention.

FIG. 14 is a diagram illustrating a control circuit 401 of the switching element 5 according to the related art related to the embodiments of the present invention. Although the operation of the current limiting circuit 19 is described herein with reference to FIG. 14, for convenience of explanation, the current limiting circuit 19 illustrated in FIG. 3 also performs a similar circuit operation. Accordingly, as for the components of the control circuit 1 that are denoted by the same reference numerals as those of the control circuit 401, the following description can also be applied to the control circuit 1.

The limitation of the collector current Ic by the current limiting circuit 19 is implemented by the following mechanism. The sensing current Isense of the IGBT 5a is supplied to the detection resistor Rs1 in the control circuit 401, a sensing voltage Vsense corresponding to the collector current Ic of the IGBT 5a is generated in the detection resistor Rs1. This sensing voltage Vsense is compared with the voltage value of a reference voltage source Vref by the amplifier 22, and a voltage corresponding to the difference therebetween is input to the voltage-to-current conversion circuit 20. The voltage-to-current conversion circuit 20 outputs the current If1 corresponding to the difference between the sensing voltage Vsense and the voltage value of the reference voltage source Vref. This current If1 becomes the second input current If1 to be input to the second current mirror circuit composed of the PMOSFET 42 and the PMOSFET 43. The second current mirror circuit outputs the second mirror current If2 corresponding to a mirror ratio in response to the input of the second input current If1. This second mirror current If2 is hereinafter referred to also as the "current limiting signal If2". Since the current limiting signal 1f2 works in a direction in which the current Ig2 for generating the gate drive voltage of the IGBT 5a is decreased, the gate voltage decreases as the current limiting signal If2 increases, which inhibits an increase in the collector current Ic. Specifically, the collector current Ic works to perform a negative feedback operation as an entire system, and thus the collector current Ic is limited to a certain predetermined value.

Specifically, the current limiting signal 112 is generated by the second input current If1 and flows into the reference current source (constant current source) I_base which is a base current source. Along with the inflow of the current limiting signal If2, the input current Ig1 of the first current mirror circuit composed of the PMOSFET 44 and the PMOSFET 45 varies, so that the current Ig2 of the first current mirror circuit varies and the gate voltage for driving the switching element 5 also varies. The current Ig2 decreases as the load current Ic increases, and thus the voltage generated by the resistor Rg1 decreases. Thus, the negative feedback control for preventing the load current Ic is implemented. In this case, the resistor Rg1 has a resistance value on the order of several tens of kΩ.

In the related art illustrated in FIG. 14, the control circuit 401 further includes an overheat protection circuit 410. The overheat protection circuit 410 includes a diode Ds1 having an anode connected to the emitter terminal E, and a third current mirror circuit composed of a PMOSFET 46 and a PMOSFET 47. The diode Ds1 is also a temperature-sensitive diode indicating an output corresponding to a temperature. The cathode of the diode Ds1 is connected to the reference side of the third current mirror circuit. Like in the current limiting function described above, an output current Is2 of the third current mirror circuit works in a direction in which the current Ig2 for generating the gate drive voltage of the IGBT 5a is decreased. Specifically, when an abnormally high temperature is detected, the current Is2 increases as the reverse saturation current Is3 of the diode Ds1 increases, and the current Ig2 works in a direction in which the current Ig2 for driving the IGBT 5a is decreased, like in the current limiting function. As the temperature rises, the current Ig2 decreases. Accordingly, the current acts to limit the current flowing to the IGBT 5a to a value lower than that during the normal operation. In other words, the load current Ic is gradually decreased along with a temperature rise. Details thereof are described in JP 2011-124269 A, and thus further descriptions are omitted.

Figure 15:
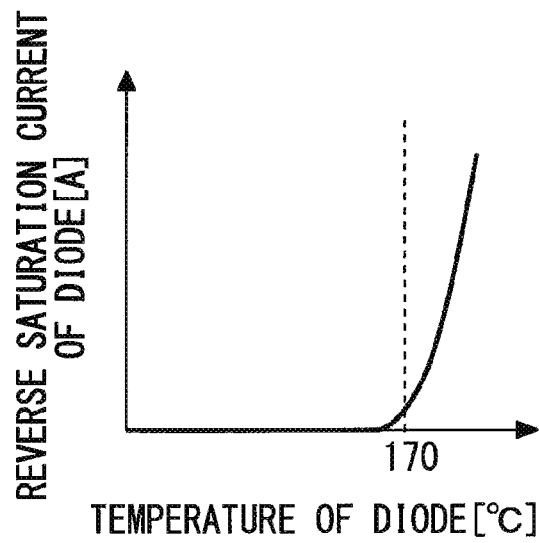
FIG. 15 is a graph illustrating an example of a relation between the reverse saturation current of the diode and the temperature of the diode related to the embodiments of the present invention.

FIG. 15 is a graph illustrating an example of a relation between the reverse saturation current Is3 of the diode Ds2 and the temperature of the diode Ds2 related to the embodiments of the present invention. The reverse saturation current of the Schottky barrier diode rises sharply at about a temperature exceeding 170° C. as illustrated in the temperature characteristic graph shown in FIG. 15. A Schottky barrier diode having characteristics similar to those illustrated in FIG. 15 can be employed as the diode Ds2 of this embodiment. The overheat detection according to the first embodiment is performed using the reverse saturation current Is3 of the diode Ds2. Assume that as the element temperature Tigbt of the IGBT 5a rises, the reverse saturation current Is3 increases with a temperature characteristic similar to that illustrated in FIG. 15.

In the first embodiment, a modified example in which the temperature detection is performed using a forward voltage of a forward-connect diode by, for example, inverting the connecting direction of the diode Ds2, may be employed. However, when the temperature detection is performed using the forward voltage of the diode, a highly accurate current control is required because the dependence on current is high. On the other hand, when the temperature detection is performed using the reverse saturation current of the diode Ds2 like in the first embodiment, there is an advantage that the dependence on voltage is low when the diode is used at a voltage equal to or lower than a backward breakdown voltage, and thus there is no need to maintain the high accuracy of the voltage to be applied to the diode Ds2.

[Operation of Circuit of First Embodiment]

Figure 4:
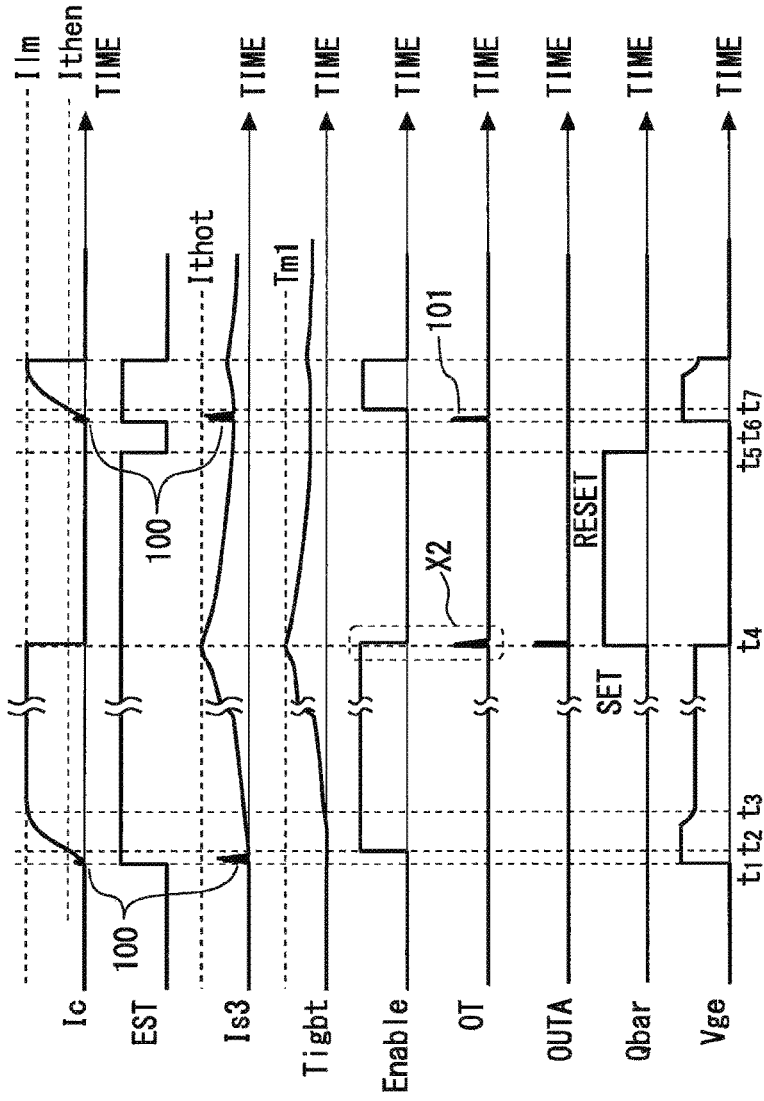
FIG. 4 is a timing diagram illustrating the operation of the control circuit of the switching element according to the first embodiment of the present invention.

FIG. 4 is a timing diagram illustrating the operation of the control circuit 1 of the switching element according to the first embodiment of the present invention.

As shown at times t1 to t3 in FIG. 4, when the control signal EST is turned on (high in the embodiment), the ON signal is transmitted to the switching element 5, and the IGBT 5a is turned on. As shown at times t2 and t7, when the load current Ic is equal to or greater than a predetermined set current value Ithen, an Enable signal becomes high. The signal Ithen may have a predetermined current value such as 1 ampere (1 A) or a predetermined current value less than 1 ampere. As shown at time t4, when the load current Ic is less than the current Ithen, the Enable signal becomes low. In this case, a state in which the Enable signal is high is expressed as "a state in which the Enable signal is output". As illustrated in FIG. 4, the set current value Ithen is set to a value smaller than the current limiting value Ilm.

At time t4, the reverse saturation current Is3 reaches a predetermined threshold. This threshold is an overheat interruption determination current Ithot illustrated in FIG. 4. At this time, as indicated by reference numeral X2, the overheat detection circuit 16 inverts the output, thereby outputting the overheat detection signal OT. Thus, an abnormally high temperature can be detected. Specifically, the overheat interruption determination current Ithot is the value of the reverse saturation current Is3 when the element temperature Tigbt reaches a set temperature Tm1 (for example, 210° C.).

In the case of performing the temperature detection using the reverse saturation current Is3 of the diode Ds2, when the switching element 5 is turned on, a displacement current 100 (also referred to as L load noise 100) is generated by the L load. At times t1 to t2 and t6 to t7 in FIG. 4, the displacement current 100 is generated. At time t6 in FIG. 4, although the element temperature Tigbt is low, the overheat detection signal OT rises (reference numeral 101) due to the displacement current 100. In this manner, erroneous temperature detection occurs in association with the L load noise 100.

Accordingly, in the first embodiment, the detection resistor Rs1 monitors the load current Ic of the switching element 5, a logical AND (OUTA in FIG. 4) of the output (i.e., the Enable signal in FIG. 4) depending on the load current Ic and the output of the overheat detection circuit 16 is used as an output for determining the overheat interruption. As seen from times t6 and t7 in FIG. 4, also in the case where output variation 101 of the overheat detection circuit 16 is generated by the displacement current 100, when the Enable signal is not output (i.e., when the output of the current detection circuit 18 is low), the logical AND OUTA does not become high. As a result, the interruption circuit 11 does not operate. Thus, an erroneous operation due to the L load noise 100 at start-up of the switching element 5 can be prevented. Specifically, only when the load current Ic is equal to or greater than the predetermined set current value and an abnormal temperature is detected, the protection (specifically, protection for completely interrupting the load current of the switching element 5) is provided. The term "set current value" described herein refers to, for example, a predetermined value such as 1 A or a value smaller than 1 A, and is a value for detecting that the load current Ic of a certain magnitude is flowing to the switching element 5.

The current limiting function described above is used for the interruption of the switching element 5. When it is determined that the temperature is abnormal and there is a need to provide the protection, the PMOSFET 48 is turned on to allow If3 to flow into the reference current source (constant current source) I_base which is a base current source. However, as for the magnitude of the current, the relation of If3≥I_base is established. Thus, the current Ig2 in the first current mirror circuit composed of the PMOSFET 44 and the PMOSFET 45 is decreased to 0 A. As a result, the gate drive signal (i.e., the gate voltage) of the switching element 5 is attenuated to 0 V, thereby allowing the switching element 5 to be turned off.

Figure 5:
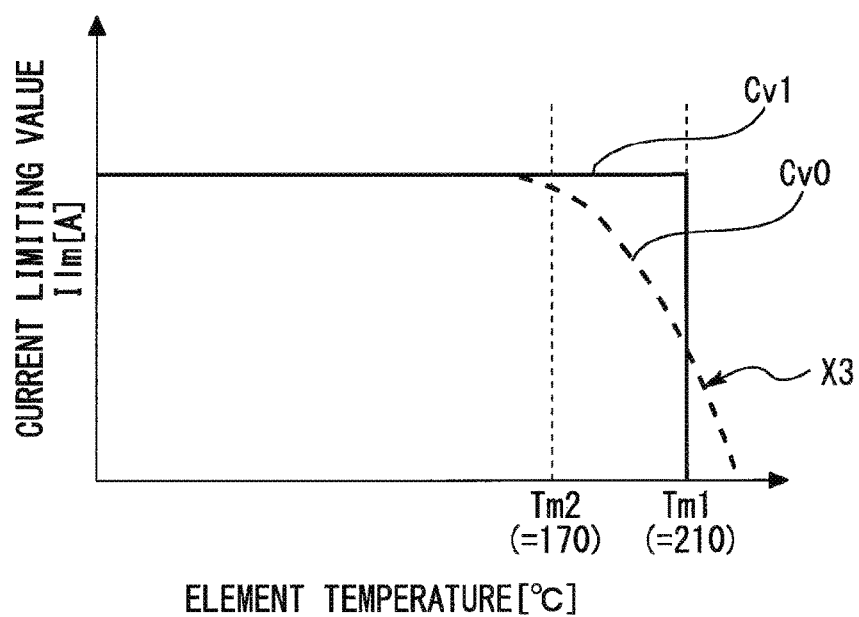
FIG. 5 is a graph illustrating a relation between the current limiting value and the element temperature in the control circuit of the switching element according to the first embodiment of the present invention.

FIG. 5 is a graph illustrating a relation between the current limiting value Ilm and the element temperature Tigbt in the control circuit 1 of the switching element according to the first embodiment of the present invention. A characteristic Cv0 illustrated in FIG. 5 represents a temperature dependence of the current limiting value Ilm in the comparative example of FIG. 14 described above. On the other hand, a characteristic Cv1 illustrated in FIG. 5 represents a temperature dependence of the current limiting value Ilm in the first embodiment. Focusing on the position indicated by an arrow X3, when the temperature detected by the diode Ds2 reaches the predetermined set temperature Tm1 (for example, 210° C. in the first embodiment), the current limiting value Ilm can be rapidly attenuated to 0 A.

Once the latch circuit 14 detects an abnormal temperature, the protection is maintained until the control signal EST is turned off. Thus, a repetition of overheat interruption and recovery prevents the load current Ic from being oscillated. The term "oscillation" of the load current Ic described herein refers to a repetition of interruption and recovery, such as abnormal temperature detection→gate signal OFF (i.e., interruption of the load current Ic)→temperature drop→gate signal ON (i.e., recovery)→temperature rise→abnormal temperature detection→interruption of the load current Ic.

When an abnormal temperature is detected, the load current Ic is interrupted rapidly, thereby making it possible to prevent shortening of the life of the switching element 5.

When the L load noise (displacement current) 100 in association with the operation of the switching element 5 is generated, there is a risk of causing erroneous temperature detection due to the diode Ds2. However, as described above, according to the first embodiment, even if the L load noise 100 is generated, the overheat protection (i.e., forcibly turning off the switching element 5) is not carried out unless the Enable signal is generated. Specifically, in the first embodiment, the AND circuit 12 determines whether or not it is necessary to perform the overheat protection based on the result of a logical operation. Accordingly, the interruption can be performed only when a certain amount of the load current Ic is flowing (i.e., the load current Ic is equal to or greater than the predetermined set current value) and it is determined that the temperature is abnormal. As a result, an unnecessary overheat protection can be prevented from being performed in association with the L load noise 100.

Figure 6:
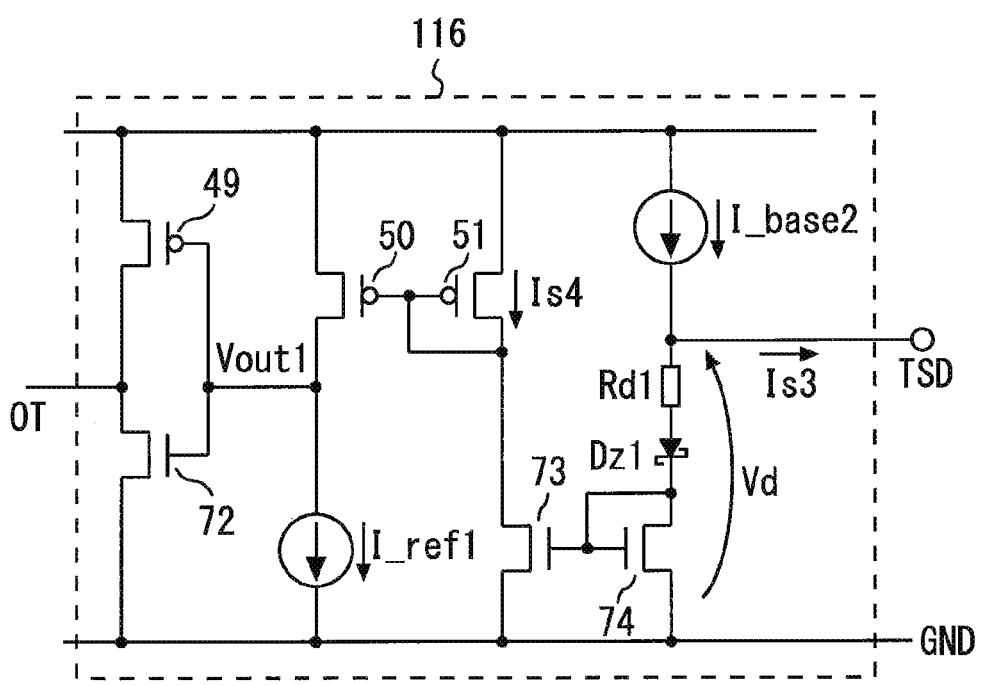
FIG. 6 is a diagram illustrating an example of the overheat detection circuit included in the control circuit of the switching element according to the first embodiment of the present invention.

FIG. 6 is a diagram illustrating an example of the overheat detection circuit included in the control circuit 1 of the switching element according to the first embodiment of the present invention. The overheat detection circuit 116 illustrated in FIG. 6 is a circuit that is applicable as the overheat detection circuit 16 illustrated in FIG. 3, and includes a current comparator. The current comparator compares a detection-side current Is4 corresponding to the reverse saturation current of the diode Ds2 with the current value of a reference current source (constant current source) Iref1. Since the reverse saturation current characteristic of the diode Ds2 is used for the temperature detection, a current comparator is preferably used as the overheat detection circuit 116, instead of using a voltage comparator. This eliminates the need for an I-V conversion circuit, unlike in the case of using a voltage comparator, which enables the miniaturization of the circuit.

In the circuit illustrated in FIG. 6, a current obtained by subtracting the reverse saturation current Is3 from the constant current source I_base2 (i.e., I_base2−Is3) is supplied to a resistor Rd1, a Schottky barrier diode Dz1, and a series circuit of an NMOSFET 74. This current generates a voltage Vd to be applied to the diode Ds2. The voltage Vd is, for example, 3 V. The NMOSFET 74 and an NMOSFET 73 constitute a fourth current mirror circuit. The NMOSFET 73 is connected to a PMOSFET 51 of a fifth current mirror circuit, which will be described later, and the common detection-side current Is4 flows thereto.

As the reverse saturation current Is3 increases along with a temperature rise, the voltage Vd decreases. However, the voltage dependence of the reverse saturation current Is3 is sufficiently smaller than the temperature dependence of the reverse saturation current Is3, and thus is negligible.

The relation between the current values of two constant current sources included in the overheat detection circuit 116 is represented by I_ref1<I_base2. The difference between I_base2 and I_ref1 (I_base2−I_ref1) corresponds to the overheat determination threshold Ithot.

As the reverse saturation current Is3 of the diode Ds2 increases along with a temperature rise, the detection-side current Is4 to be compared with the I_ref1 decreases. Note that the relation "Is4≈I_base2−Is3" is established.

In the fifth current mirror circuit composed of a PMOSFET 50 and a PMOFET 51, the detection-side current Is4 flows to the PMOFET 51 and a mirror current obtained by duplicating the detection-side current Is4 flows to the PMOSFET 50. A node between the PMOSFET 50 and the constant current source I_ref1 corresponds to an output Vout1. During the normal operation, the relation of I_ref1<Is4 is maintained, and thus the output Vout1 is at a high level. However, when an abnormally high temperature is detected and the reverse saturation current Is3 of the diode Ds2 exceeds the overheat determination threshold Ithot, the relation of I_ref1>Is4 is established and the output Vout1 is at a low level. The output Vout1 is input to a CMOS circuit which is composed of a PMOSFET 49 and an NMOSFET 72, and an output from the CMOS circuit corresponds to the overheat detection signal OT. Thus, the overheat detection when an abnormal temperature is detected can be performed.

Figure 7:
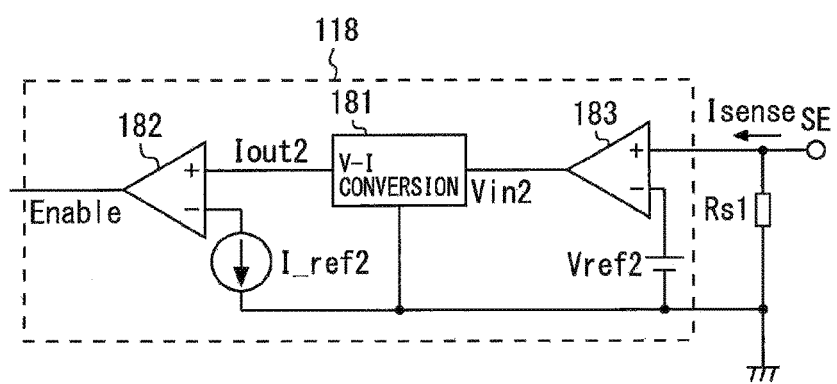
FIG. 7 is a block diagram illustrating an example of the current detection circuit included in the control circuit of the switching element according to the first embodiment of the present invention.

FIG. 7 is a block diagram illustrating an example of the current detection circuit included in the control circuit 1 of the switching element according to the first embodiment of the present invention. A current detection circuit 118 illustrated in FIG. 7 includes a voltage-to-current conversion circuit 181 that converts a voltage corresponding to a difference between the voltage generated in the detection resistor Rs1 and a reference voltage source Vref2 into a current, and a current comparator 182 that compares the current obtained through the conversion by the voltage-to-current conversion circuit 181 with a current value of a reference current source (constant current source) I_ref2.

The current detection by the current detection circuit 118 illustrated in FIG. 7 is implemented by the following mechanism. The sensing current Isense of the switching element 5 is supplied to the detection resistor Rs1 in the control circuit 1. A voltage proportional to the load current Ic of the switching element 5 is generated in the detection resistor Rs1. The voltage generated in the detection resistor Rs1 is compared with the reference voltage source Vref2 by an amplifier 183. An output from the amplifier 183 is input to the voltage-to-current conversion circuit 181. A current Iout2 corresponding to the difference between the voltage generated in the detection resistor Rs1 and the reference voltage source Vref2 is output by the voltage-to-current conversion circuit 181. This output current Iout2 is compared with the reference current source (constant current source) I_ref2 by the current comparator 182, and a determination voltage Enable is output to thereby perform the current detection.

Figure 8:
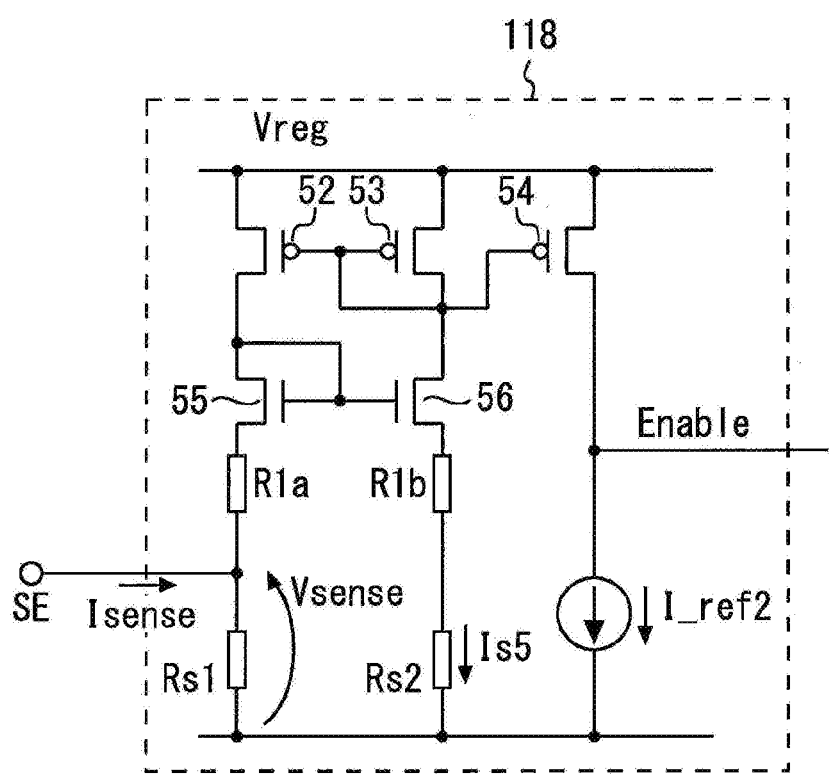
FIG. 8 is a diagram illustrating an example of a current detection circuit included in the control circuit of the switching element according to the first embodiment of the present invention.

FIG. 8 is a diagram illustrating an example of a current detection circuit included in the control circuit 1 of the switching element according to the first embodiment of the present invention, and illustrates an example in which the block diagram illustrated in FIG. 7 is implemented in a specific circuit configuration. The current detection circuit 118 includes a sixth current mirror circuit which is composed of a PMOSFET 52 and a PMOSFET 53, each of which has one end connected to a voltage Vreg, and a seventh current mirror circuit which is composed of an NMOSFET 55 and an NMOSFET 56 which are connected in cascade in the sixth current mirror circuit. A resistor R1*a* and the detection resistor Rs1 are connected in series with the NMOSFET 55. A resistor R1*b* and a detection resistor Rs2 are connected in series with the NMOSFET 56. A PMOSFET 54 and the PMOSFET 52 constitute an eighth current mirror circuit, and a node between the PMOSFET 54 and a constant current source Iref2 corresponds to an output point of the Enable signal. A drain-source current of the PMOSFET 54 flows to the constant current source Iref2.

In the detection resistor Rs1, the sensing voltage Vsense is generated by the sensing current Isense which is proportional to the load current Ic. The detection resistor Rs1 is, for example, 30Ω. The sensing current Isense is a current that is, for example, 1/1000 of the load current Ic, and has a magnitude of, for example, several mA to several tens of mA. The voltage generated in the detection resistor Rs1 by the sensing current Isense is, for example, several tens of mV to several hundreds mV.

A detection-side current Is5 is determined by the sensing voltage Vsense generated in the detection resistor Rs1 and the detection resistor Rs2 used for V-I conversion. The detection resistor Rs2 is, for example, 5 kW. As the load current Ic increases, the voltage generated in the detection resistor Rs1 increases, so that the detection-side current Is5 also increases.

For example, a case where the sensing current Isense of 1 mA or more is detected is referred to as "current detection time". The detection threshold voltage (e.g., 30 mV) generated in the detection resistor Rs2 during the current detection time is extremely small. Accordingly, the voltage-to-current conversion circuit converts the voltage into a current of, for example, about 5 μA, and the current is compared with the reference current source (constant current source) I_ref2 as a current comparator. Thus, the risk of causing an erroneous determination is lowered as compared with the voltage comparator, which leads to an improvement in accuracy of the determination.

When the relation between the converted detection-side current Is5 and the reference-side current I_ref2 is represented by Iref_2>Is5, the output Enable is at a low level. When the relation of I_ref2<Is5 is established, the output Enable is at a high level. That is, Iref_2 corresponds to a comparator threshold.

The temperature detection of the switching element 5 is performed using the reverse saturation current Is3 of the diode Ds2. Accordingly, the use of the current comparator eliminates the need for an I-V conversion circuit, unlike in the case of using a voltage comparator, which enables the miniaturization of the circuit. Further, the voltage generated by the detection resistor Rs1 by the current detection circuit 18 is several tens of mV, which is extremely small. Accordingly, the determination of an output using the current comparator after a current is converted in the voltage-to-current conversion circuit makes it possible to improve the determination accuracy, as compared with the voltage comparator.

Second Embodiment

An ignitor semiconductor device according to a second embodiment has a circuit configuration similar to that of the semiconductor device 10 according to the first embodiment, except that the control circuit 1 is replaced by a control circuit 201. The control circuit 201 according to the second embodiment has a circuit configuration similar to that of the control circuit 1 according to the first embodiment, except that an attenuating circuit 210 is added. Accordingly, in the following description, the same or corresponding components as those of the first embodiment are denoted by the same reference numerals, differences between the second embodiment and the first embodiment are mainly described and the descriptions of common features are abbreviated or omitted.

Figure 9:
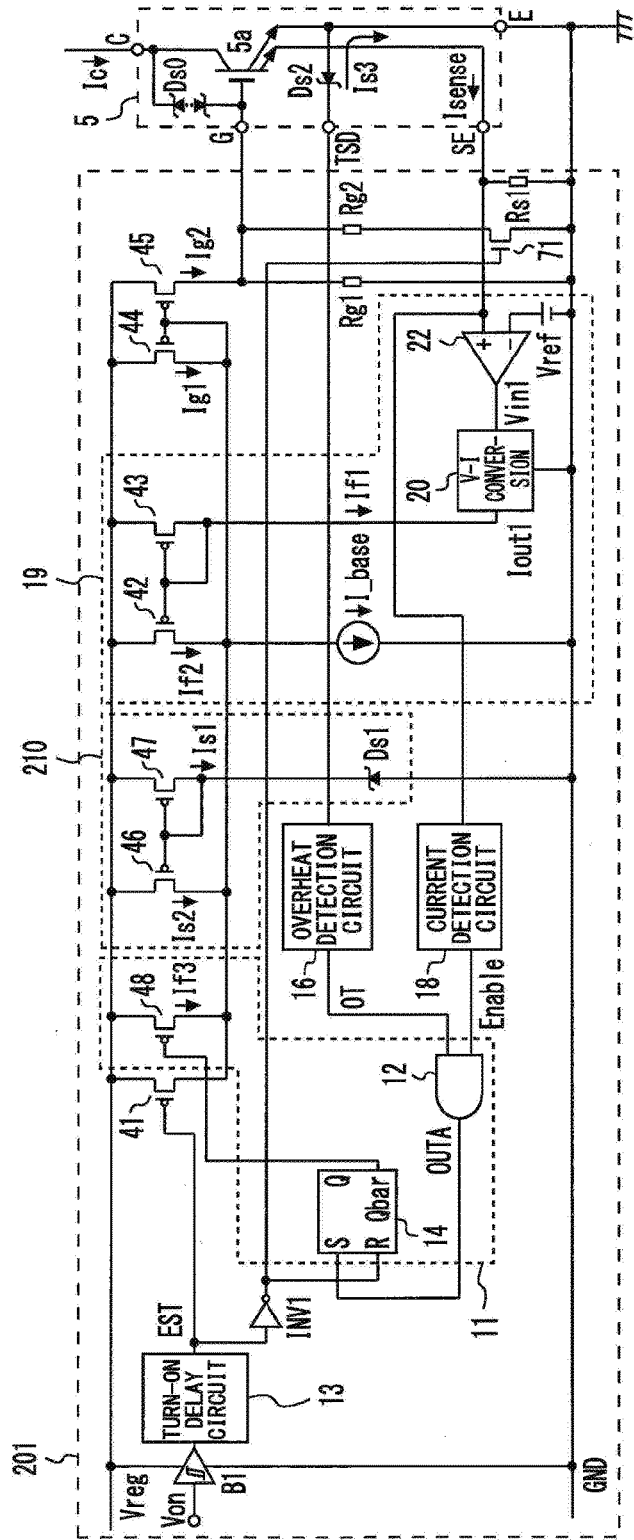
FIG. 9 is a diagram illustrating the control circuit of the switching element according to the second embodiment of the present invention.

FIG. 9 is a diagram illustrating the control circuit 201 of the switching element according to the second embodiment of the present invention. The control circuit 201 according to the second embodiment includes the attenuating circuit 210 for providing the current limiting value Ilm with a temperature characteristic. The attenuating circuit 210 includes the diode Ds1, which is a temperature sensing element, and the second current mirror circuit composed of the MOSFET 46 and the MOSFET 47. In this respect, the attenuating circuit 210 is similar to the overheat protection circuit 410 of the related art illustrated in FIG. 14.

The attenuating circuit 210 attenuates the gate drive signal (i.e., the gate voltage) so as to reduce the load current Ic when the sensed temperature of the Zener diode Ds1 reaches a temperature equal to or higher than a predetermined reference temperature (Tm2). The value of the reference temperature Tm2 is lower than that of the set temperature Tm1. The current limiting value Ilm is provided with a temperature characteristic and is reduced when a temperature equal to or higher than the reference temperature Tm2 (e.g., 170° C.) is exceeded, thereby reducing the load current Ic with the characteristic illustrated in FIG. 10. Specifically, in particular, according to the second embodiment, the load current Ic is reduced as the temperature increases, and the decreasing rate of the load current Ic increases as the temperature further increases, so that the load current Ic decreases sharply in a curved manner as the temperature rises. The reference temperature Tm2 is set to be lower than the set temperature Tm1, thereby enabling the current attenuation function of the attenuating circuit 210 and the current interruption function of the interruption circuit 11 to operate cooperatively.

The operation principle will be described in more detail below. First, a low voltage corresponding to the voltage about the threshold of the PMOSFET 47 is applied between the anode and the cathode of the diode Ds1 from the control power Vreg. The reverse saturation current Ts3 shows an exponential increase with respect to the temperature. For example, the diode Ds2 having a size and specifications for obtaining a current on the order that affects the constant current source I_base in the vicinity of the temperature Tm2 (170° C.) is selected. Thus, the operation at a temperature equal to or lower than the temperature Tm2 (170° C.) is performed so as not to affect driving of the switching element 5 described above.

Figure 10:
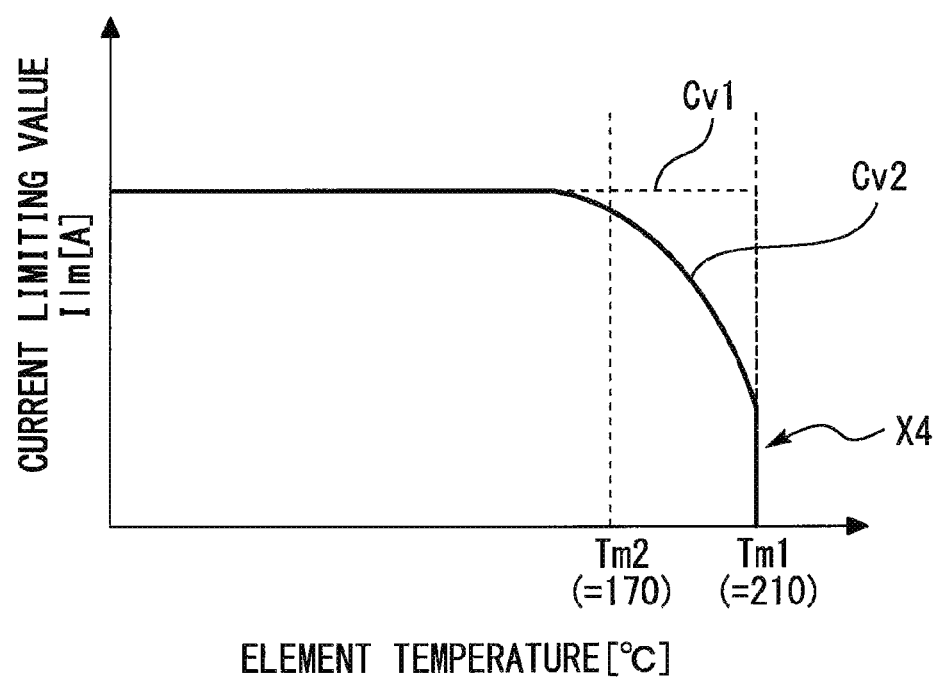
FIG. 10 is a graph illustrating a relation between the current limiting value and the temperature in the control circuit of the switching element according to the second embodiment of the present invention.

When the element temperature Tigbt is higher than a normal use temperature (for example, 170° C. or higher), the reverse saturation current Is1 of the diode Ds1 flows through the PMOSFET 47. As described above in the related art of FIG. 14, the PMOSFET 47 and the PMOSFET 46 constitute the third current mirror circuit. Accordingly, the reverse saturation current Is1 flowing through the PMOSFET 47 generates the drain current Is2 of the PMOSFET 46. The drain current Is2 has the same effect as that of the current limiting signal If2 of the current limiting circuit 19, and works in a direction in which the current Ig2 that generates the gate drive voltage of the IGBT 5a is decreased. Accordingly, when the drain current Is2 is generated, an effect that is substantially the same as the effect obtained when the current of the constant current source I_base is reduced is generated. Thus, Ig2 decreases and the current limiting value Ilm has a temperature characteristic as illustrated in FIG. 10. Further, when the element temperature Tigbt rises and reaches the set temperature Tm1, the operation shifts to the operation of the interruption circuit 11 described in the first embodiment, and the switching element 5 is completely turned off (the load current Ic is completely interrupted).

FIG. 10 is a graph illustrating a relation between the current limiting value Ilm and the temperature in the control circuit 1 of the switching element according to the second embodiment of the present invention. As illustrated in FIG. 10, at a high temperature side, the current limiting value Ilm is provided with a temperature characteristic at a certain temperature Tm2 (e.g., 170° C.) or higher. Due to this temperature characteristic, the current limiting value Ilm gradually decreases along with a temperature rise. In the temperature range of Tm2 to Tm1 (170° C. to 210° C.), the current limiting value Ilm is gradually decreased and a Joule loss is prevented from being generated in the switching element 5, to thereby prevent heat generation.

On the other hand, when the temperature further rises and reaches the set temperature Tm1 (e.g., 210° C.) at which there is a need to perform the interruption urgently, the switching element 5 is forcibly interrupted when the output from the AND circuit 12 shows the occurrence of overheat. Specifically, when an abnormally high temperature that exceeds the set temperature Tm1 (210° C.) is detected, the switching element 5 is completely interrupted.

Thus, an unnecessary arc discharge is prevented, as much as possible, from being generated in the ignition plug, and when the temperature at which there is a need to perform the interruption urgently is reached, the load current Ic can be forcibly interrupted. As a result, shortening of the life of each of the switching element 5 and the engine can be prevented. In other words, when the temperature of the switching element 5 exceeds a certain temperature, the current limiting value Ilm is reduced to prevent a temperature rise, thereby making it possible to prevent, as much as possible, the ignition operation from being performed at an unintended timing of the engine control computer. Nevertheless, if the temperature continues to rise and the abnormal heat generation is excessive, the switching element 5 is interrupted urgently, thereby making it possible to prevent shortening of the life of the switching element 5.

Since the current limiting value Ilm during the current interruption can be set to be lower than that in the first embodiment, the load on the switching element 5 is small and the effect of preventing shortening of the life can be further increased.

Third Embodiment

An ignitor semiconductor device according to the third embodiment has a circuit configuration similar to that of the ignitor semiconductor device 10 according to the first embodiment, except that the control circuit 1 is replaced by a control circuit 301. The control circuit 301 according to the third embodiment has a circuit configuration similar to that of the control circuit 1 according to the first embodiment, except that an attenuating circuit 310 is added. Accordingly, in the following description, the same or corresponding components as those of the first embodiment are denoted by the same reference numerals, differences between the third embodiment and the first embodiment are mainly described and the descriptions of common features are abbreviated or omitted.

Figure 11:
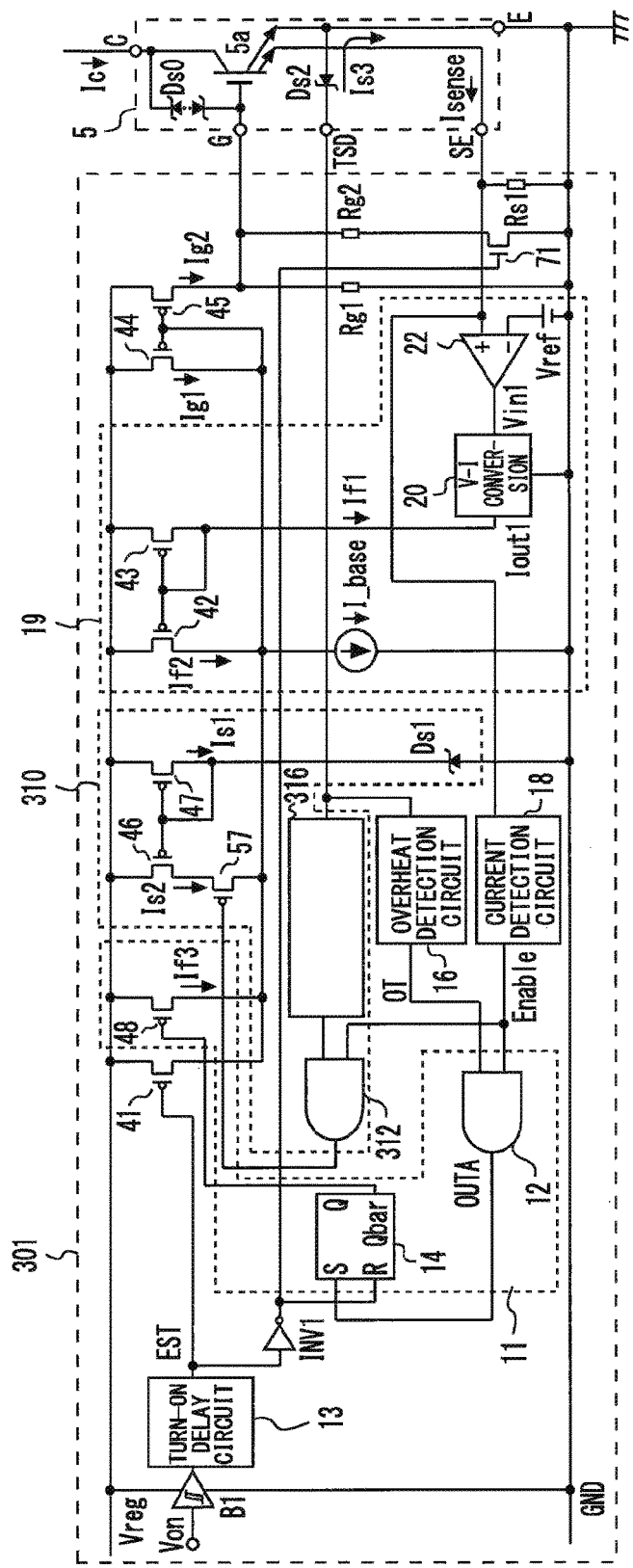
FIG. 11 is a diagram illustrating the control circuit of the switching element according to the third embodiment of the present invention.

FIG. 11 is a diagram illustrating the control circuit 301 of the switching element according to the third embodiment of the present invention. The attenuating circuit 310 has a circuit configuration similar to that of the attenuating circuit 210, and further includes a PMOSFET 57, an AND circuit 312, and a current limiting attenuation start temperature detection circuit 316. The PMOSFET 57 is interposed between the PMOSFET 46 and the constant current source I_base, and switches the electrical connection therebetween. The gate of the PMOSFET 57 is controlled by an output signal from the AND circuit 312. The AND circuit 312 receives a signal from the current limiting attenuation start temperature detection circuit 316 and the current detection signal Enable from the current detection circuit 18. The current limiting attenuation start temperature detection circuit 316 can detect the temperature of the IGBT 5a based on the reverse saturation current Is3 of the diode Ds2, like the overheat detection circuit 16.

In the third embodiment, another system including the current limiting attenuation start temperature detection circuit 316 and the AND circuit 312 is provided in the control circuit 301. This is a device for starting the attenuation of the current limiting value Ilm from a desired start temperature which is different from the temperature detected by the overheat detection circuit 16.

A specific operation will be described below. First, the overheat detection method is performed using the reverse saturation current Is3 of the diode Ds2 as described in the first embodiment. Like in the first embodiment, when the reverse saturation current Is3 of the diode Ds2 rises to the preliminarily set overheat interruption determination current Ithot, in other words, when the temperature of the IGBT 5a rises to the set temperature Tm1, it is determined that an abnormal temperature is detected. The AND circuit 312 calculates a logical AND of the current detection circuit 18 that detects the load current Ic and the current limiting attenuation start temperature detection circuit 316. Like the AND circuit 12 in the first embodiment, upon receiving the overheat detection signal OT and the current detection signal Enable, the AND circuit 312 outputs an overheat determination output (details thereof are similar to OUTA in FIG. 4). The PMOSFET 57 is turned on in response to the overheat determination output from the AND circuit 312.

The current Is2 generated by the diode Ds1, the PMOSFET 46, and the PMOSFET 47 flows into the reference current source (constant current source) I_base, which is a base current source, and reduces the current Ig2 for driving the switching element 5. In this case, the PMOSFET 57 is constantly turned off until low current limiting attenuation start temperatures Tm2 to Tm4 are reached from the set temperature Tm1. Accordingly, it is possible to prevent the current limiting value Ilm from being decreased in a temperature region of the set temperature Tm1 or less and to prevent an ignition energy from being lowered in a low temperature region.

Figure 12:
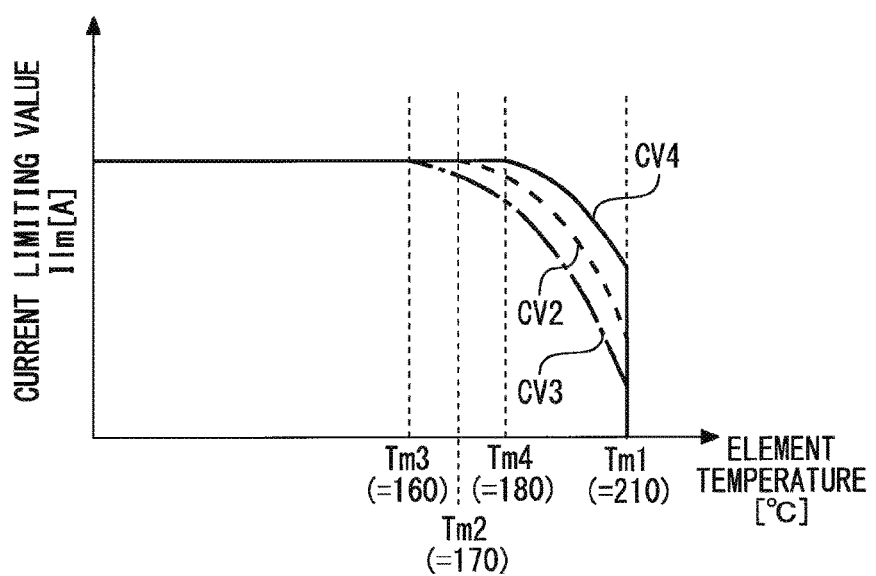
FIG. 12 is a graph illustrating a relation between the current limiting value and the temperature in the control circuit of the switching element according to the third embodiment of the present invention.

FIG. 12 is a graph illustrating a relation between the current limiting value Ilm and the temperature in the control circuit 1 of the switching element according to the third embodiment of the present invention. The temperature for starting the current limitation can be freely set by the current limiting attenuation start temperature detection circuit 316, independently of the overheat detection circuit 16. As a result, temperature characteristics Cv2, Cv3, and Cv4 of the current limiting value Ilm as illustrated in FIG. 12 can be arbitrarily designed. FIG. 12 illustrates examples of the characteristics Cv2 to Cv4 when threshold temperatures of the current limiting attenuation start temperature detection circuit 316 are respectively set to the current limiting attenuation start temperature Tm2 (170C), the current limiting attenuation start temperature Tm3 (for example, 160° C.), and the current limiting attenuation start temperature Tm4 (for example, 180° C.). According to the third embodiment, there is no need for adjustment of the temperature characteristic of the diode Ds1 (Specifically, size adjustment, impurity concentration adjustment, etc.), which leads to a drastic improvement in custom property.

Figure 13:
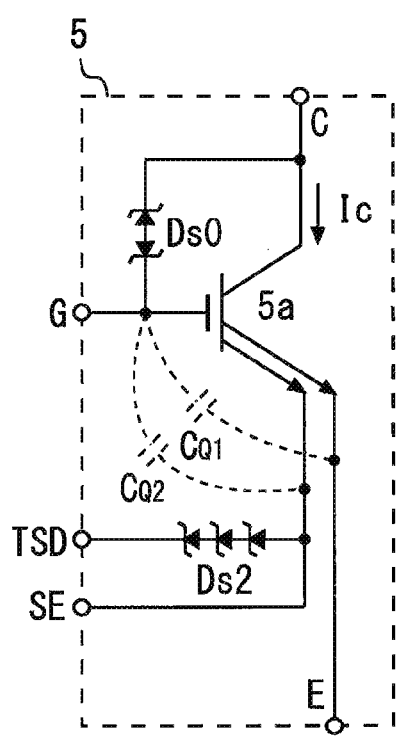
FIG. 13 is a diagram illustrating the switching element according to a modified example applicable to the first to third embodiments of the present invention.

FIG. 13 is a diagram illustrating the switching element 5 according to a modified example applicable to the first to third embodiments of the present invention. In the modified example illustrated in FIG. 13, the anode of the diode Ds2 for temperature detection that is incorporated in the switching element 5 is not connected to the emitter terminal E of the switching element 5, but to the current sensing terminal SE. Parasitic capacitances $C_{Q1}$ and $C_{Q2}$ are present between the gate (G) and the emitter (E) and between the gate (G) and the sensing emitter (SE), respectively, and the parasitic capacitance between G and E is substantially larger than that between G and SE. In the first to third embodiments, the anode of the diode Ds2 for temperature detection is connected to the emitter (E), the G-E capacitance increases. As a result, when the load current Ic at start-up of the switching element 5 flows, the displacement current 100 (L load noise 100) generated in the diode Ds2 increases. In this case, the risk of causing an erroneous temperature detection increases. On the other hand, the capacitance between the gate (G) and the sensing emitter (SE) is smaller than the capacitance between gate (G) and the emitter (E). Accordingly, the anode of the diode Ds2 is connected to the sensing emitter (SE) to reduce the capacitance between the sensing emitter and the gate, thereby making it possible to prevent the L load noise 100 from being generated at the time of start-up.

Fourth Embodiment

In the first to third embodiments described above, a logic circuit for performing a logical operation other than a logical AND may be provided instead of the AND circuit 12. Specifically, an OR circuit for calculating a logical OR, an NOR circuit for calculating a logical NOR, or an NAND circuit for calculating a logical NAND may be provided instead of the AND circuit 12. A fourth embodiment illustrates, for example, a circuit configuration using an NOR circuit.

Figure 16:
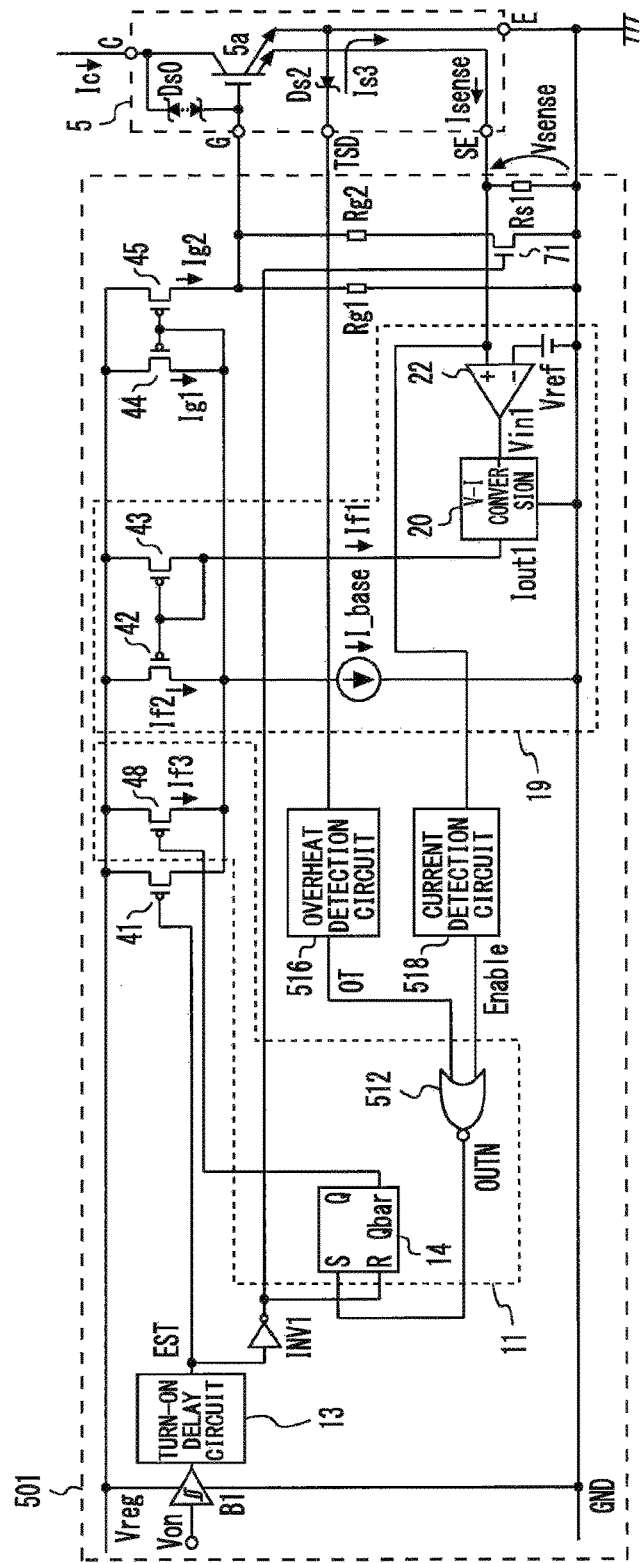
FIG. 16 is a diagram illustrating a control circuit of a semiconductor switching element according to the fourth embodiment of the present invention.

FIG. 16 is a diagram illustrating a control circuit 501 of a semiconductor switching element according to the fourth embodiment of the present invention. An ignitor semiconductor device according to the fourth embodiment has a circuit configuration similar to that of the ignitor semiconductor device 10 according to the first embodiment, except that the control circuit 1 is replaced by the control circuit 501. The control circuit 501 according to the fourth embodiment has a circuit configuration similar to that of the control circuit 1 according to the first embodiment, except that the AND circuit 12, the overheat detection circuit 16, and the current detection circuit 18 are replaced by an NOR circuit 512, an overheat detection circuit 516, and a current detection circuit 518, respectively. Accordingly, in the following description, the same or corresponding components as those of the first embodiment are denoted by the same reference numerals, differences between the fourth embodiment and the first embodiment are mainly described and the descriptions of common features are abbreviated or omitted.

Figure 17:
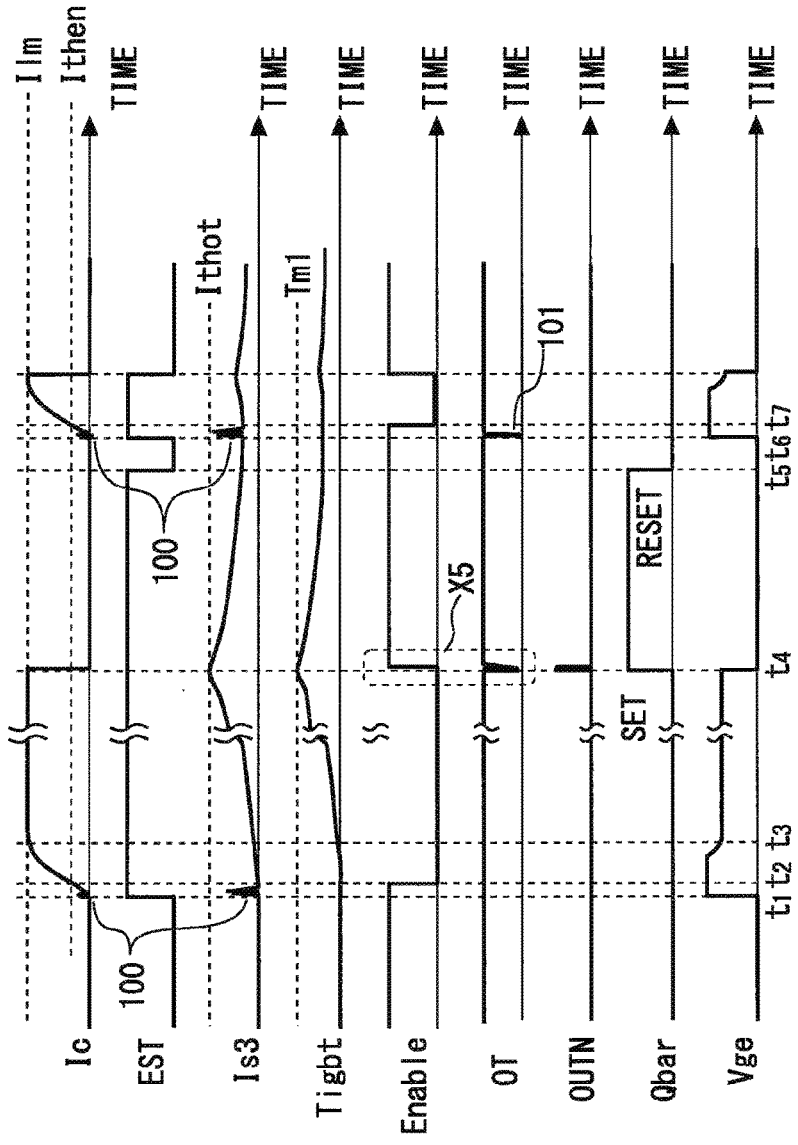
FIG. 17 is a timing diagram illustrating the operation of the control circuit of the switching element according to the fourth embodiment of the present invention.
Figure 18:
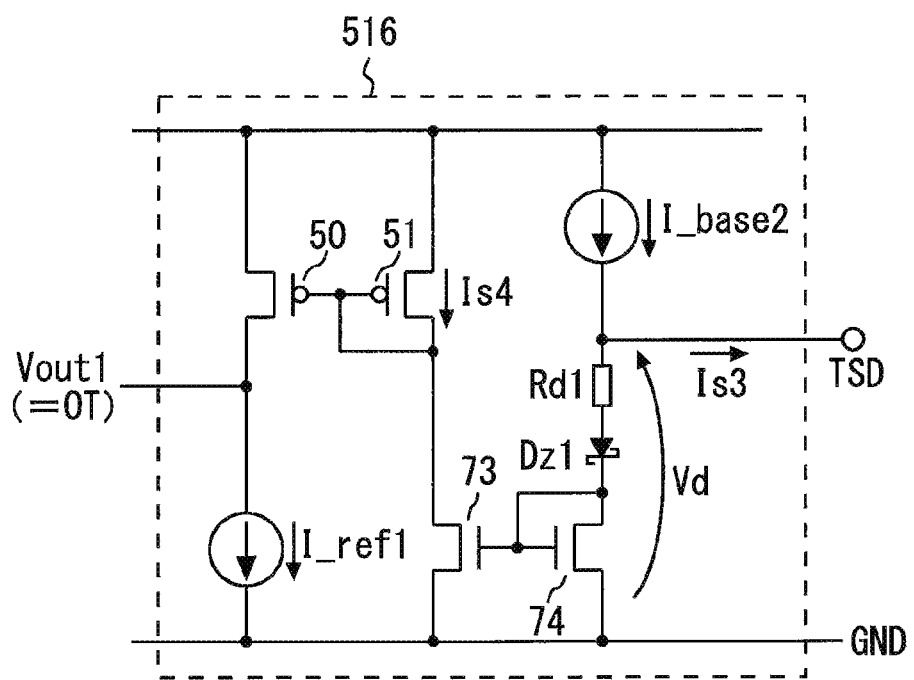
FIG. 18 is a diagram illustrating an example of the overheat detection circuit included in the control circuit according to the fourth embodiment of the present invention.

FIG. 17 is a timing diagram illustrating the operation of the control circuit 501. Comparing the timing diagrams of FIGS. 17 and 4 with each other, it can be seen that the high level and the low level of the current detection signal Enable and the overheat detection signal OT are opposite in FIGS. 17 and 4. FIG. 18 is a diagram illustrating an example of the overheat detection circuit 516 included in the control circuit 501. The overheat detection circuit 516 illustrated in FIG. 18 has a configuration in which the inverter composed of the PMOSFET 49 and the NMOSFET 72 included in the overheat detection circuit 116 illustrated in FIG. 6 is omitted. The overheat detection circuit 516 outputs a high output in a normal temperature region, and outputs a low output when an abnormal temperature is detected (specifically, when the detected temperature detected based on the output of the diode Ds2 is equal to or higher than the predetermined set temperature Tm1).

Figure 19:
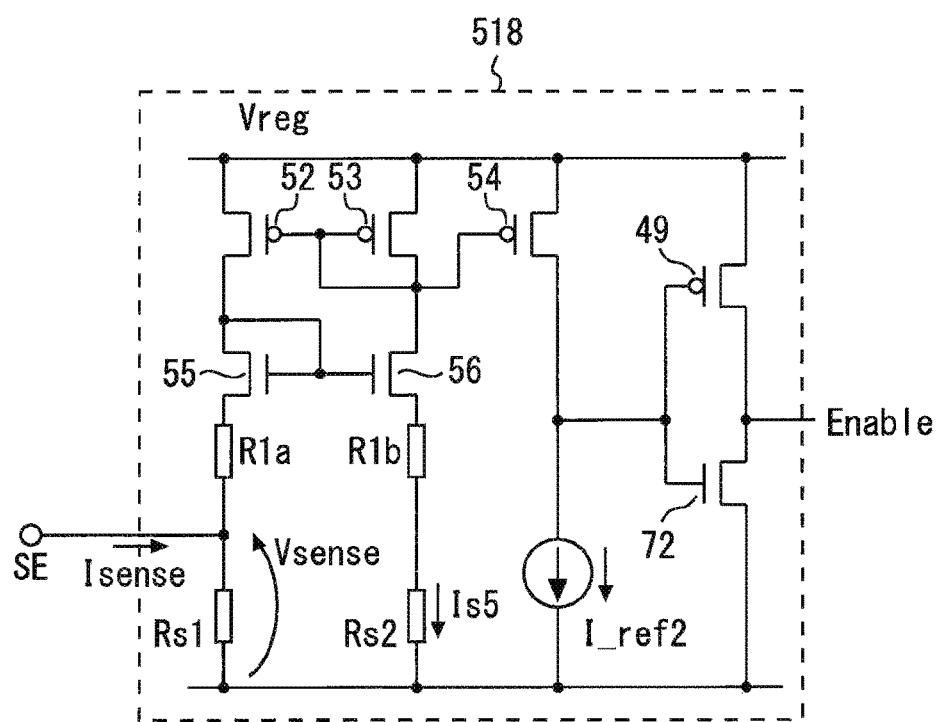
FIG. 19 is a diagram illustrating an example of the current detection circuit included in the control circuit according to the fourth embodiment of the present invention.

FIG. 19 is a diagram illustrating an example of the current detection circuit 518 included in the control circuit 501. The current detection circuit 518 illustrated in FIG. 19 has a configuration in which an inverter composed of the PMOSFET 49 and the NMOSFET 72 is added to the output stage of the current detection circuit 118 illustrated in FIG. 8. The current detection circuit 518 is similar to the current detection circuit 18 in that the current detection signal Enable is output when the output value of the current sensing terminal SE is equal to or greater than the "set current value" described in the first embodiment. However, the current detection circuit 518 outputs a high output when the output value of the current sensing terminal SE is less than the set current value, and outputs a low output, as the current detection signal Enable, when the output value of the current sensing terminal SE is equal to or greater than the set current value.

At a timing indicated by a reference numeral X5 in the timing diagram of FIG. 17, the overheat detection circuit 516 outputs the low output as the overheat detection signal OT, and the current detection circuit 518 outputs the low output as the current detection signal Enable. When these two low outputs are input to the NOR circuit 512, an output signal OUTN of the NOR circuit 512 becomes high. Since the output signal OUTN is input to the set terminal S of the latch circuit 14, the subsequent operation is performed in a similar manner to the circuit operation of the first embodiment.

While the fourth embodiment illustrates a case where the NOR circuit 512 is applied in the circuit configuration of the first embodiment, the NOR circuit 512 may also be used in the second and third embodiments. Various modifications described in the first to third embodiments may be applied to the fourth embodiment. Further, instead of using the NOR circuit 512, a logic circuit for calculating a logical OR (OR logic) or a logical NAND (NAND logic) may be applied. It is only necessary to match the logics of a logic circuit, a subsequent-stage circuit (latch circuit), and pro-stage circuits (an overheat detection circuit and a current detection circuit) so that, when both the overheat detection signal from the overheat detection circuit and the current detection signal from the current detection circuit are input, the logic circuit switches the output signal to implement the circuit operation described in the first to fourth embodiments.

Note that, for example, paragraph 0039 to 0041 and FIG. 4 of WO 2012/077187 disclose a circuit that outputs an overcurrent detection signal and an overheat detection signal to an AND circuit. However, in the circuit disclosed in WO 2012/077187, an upper arm temperature and a lower arm temperature are compared to determine which one of the temperatures is higher than the other one of the temperatures. Since the upper arm temperature and the lower arm temperature varies depending on the operation conditions, the circuit disclosed in WO 2012/077187 does not compare an overheat detection signal with the "predetermined set temperature". The circuit disclosed in WO 2012/077187 differs from the current detection circuit 18 according to the above embodiments in that overcurrent detection in the circuit disclosed in WO 2012/077187, whereas the current detection circuit 18 according to the above embodiments detects whether a certain amount or more of the load current Ic is flowing so as to determine whether or not the switching element 5 is turned on. That is, since the current detection circuit is not used for overcurrent detection, there is no need to set the set current value (the set current value Ithen in the embodiments) used for comparison and determination of the load current Ic to a large current value, unlike in the case of overcurrent determination. As the set current value (the set current value Ithen in the embodiments) used for comparison and determination of the load current Ic, a value for determining whether a certain amount of current is flowing to the IGBT 5a as described above, for example, a predetermined current value of 1 A or smaller can be set.

REFERENCE SIGNS LIST 1, 201, 301, 401, 501 control circuit
4 drive circuit
5 switching element
5a IGBT
6 transformer
6a primary winding
6b secondary winding
7 spark plug
10 ignitor semiconductor device
11 interruption circuit
12, 312 AND circuit
13 turn-on delay circuit
14 latch circuit
16, 116, 516 overheat detection circuit
18, 118, 518 current detection circuit
19 current limiting circuit
20, 181 voltage-to-current conversion circuit (V-I conversion circuit)
22, 183 amplifier
100 displacement current (L load noise)
101 output variation (erroneous temperature detection)
182 current comparator
210, 310 attenuating circuit
316 current limiting attenuation start temperature detection circuit
410 overheat protection circuit
512 NOR circuit
B1 Schmitt trigger circuit
Ds0 clamping Zener diode
INV1 inverter
Ds1, Ds2 diode
Dz1 Schottky barrier diode
Enable current detection signal
OT overheat detection signal
SE current sense terminal
EST control signal
Ic collector current (load current)
Ig1 first input current
Ig2 first mirror current
If1 second input current
If2 second mirror current (current limiting signal)
Ilm current limiting value
Is1, Is3 reverse saturation current
Isense sense current
Ithen set current value
Ithot overheat interruption determination current
Rs1, Rs2 detection resistor
Tigbt element temperature
TSD temperature sensing terminal
Vreg control power

The invention claimed is:

1. A control circuit for a semiconductor switching element, the control circuit including a control terminal, a main electrode terminal, and a current sensing terminal and being configured to control the semiconductor switching element including a diode connected to the main electrode terminal or the current sensing terminal, the control circuit comprising:

an overheat detection circuit configured to generate an overheat detection signal when a temperature detected based on an output of the diode is equal to or higher than a predetermined set temperature;

a current detection circuit configured to generate a current detection signal when an output value of the current sensing terminal is equal to or greater than a predetermined set current value; and an interruption circuit configured to turn off the semiconductor switching element when both the overheat detection signal from the overheat detection circuit and the current detection signal from the current detection circuit are input.

2. The control circuit for the semiconductor switching element according to claim 1, further comprising a first current mirror circuit configured to generate a first mirror current obtained by duplicating a first input current and uses the first mirror current as a signal to be input to the control terminal of the semiconductor switching element, wherein the interruption circuit turns off the semiconductor switching element by reducing the first input current.

3. The control circuit for the semiconductor switching element according to claim 2, wherein the interruption circuit includes:
a logic circuit configured to perform a logical operation based on a value of the overheat detection signal and a value of the current detection signal;
a latch circuit configured to latch an output value in response to an output change of the logic circuit; and
a switch element configured to operate in response to the latch of the output value of the latch circuit to reduce the first input current, and when both the overheat detection signal and the current detection signal are output, the latch circuit continuously operates the switching element to maintain the semiconductor switching element in a stopped state.

4. The control circuit for the semiconductor switching element according to claim 2, further comprising a current limiting circuit including a second current mirror circuit configured to generate a second mirror current obtained by duplicating a second input current, and a constant current source connected to a junction between the second mirror current and the first input current, the current limiting circuit being configured to adjust the second input current based on an output value of the current sensing terminal to limit a load current of the semiconductor switching element to a preliminarily set current limiting value.

5. The control circuit for the semiconductor switching element according to claim 4, wherein the set current value is a value lower than the current limiting value.

6. The control circuit for the semiconductor switching element according to claim 5, wherein the set current value is equal to or less than 1 ampere.

7. The control circuit for the semiconductor switching element according to claim 1, wherein the diode has an anode connected to the main electrode terminal or the current sensing terminal, and a cathode connected to the overheat detection circuit, and
the overheat detection circuit performs temperature detection based on a value of a reverse saturation current flowing through the cathode of the diode.

8. The control circuit for the semiconductor switching element according to claim 7, wherein the anode of the diode is connected to the current sensing terminal.

9. The control circuit for the semiconductor switching element according to claim 1, wherein the overheat detection circuit includes a first current comparator configured to compare a current value corresponding to the current flowing through the diode with a first reference current source value.

10. The control circuit for the semiconductor switching element according to claim 1, wherein the current detection circuit includes:
a voltage-to-current conversion circuit configured to convert a voltage corresponding to a difference between a reference voltage source and a sensing voltage corresponding to an output value of the current sensing terminal into a current; and
a second current comparator configured to compare the current obtained through the conversion by the voltage-to-current conversion circuit with a second reference current value.

11. The control circuit for the semiconductor switching element according to claim 1, further comprising an attenuating circuit including a temperature sensing element and being configured to adjust a gate voltage of the semiconductor switching element to reduce a load current flowing through the main electrode terminal of the semiconductor switching element as a sensed temperature rises when a sensed temperature of the temperature sensing element rises to a temperature that is equal to or higher than a predetermined reference temperature which is lower than the set temperature.

12. The control circuit for the semiconductor switching element according to claim 11, wherein
the attenuating circuit further includes a current limiting attenuation start temperature detection circuit configured to determine whether or not a temperature detected based on an output of the diode is equal to or higher than a preliminarily set start temperature,
the attenuating circuit starts the adjustment of the gate voltage when the temperature detected by the current limiting attenuation start temperature detection circuit based on the output of the diode is determined to be equal to or higher than the start temperature, and
the start temperature is settable to another value different from the reference temperature.

13. A semiconductor device that controls a current caused to flow through an induction load to energize an ignition plug of an internal combustion engine, the semiconductor device comprising:
a semiconductor switching element including a main electrode terminal and a current sensing terminal, the main electrode terminal being connected to the induction load;
a diode connected to the main electrode terminal or the current sensing terminal;
an overheat detection circuit configured to output an overheat detection signal when a temperature detected based on an output of the diode is equal to or higher than a predetermined set temperature;
a current detection circuit configured to output a current detection signal when an output value of the current sensing terminal is equal to or greater than a predetermined set current value; and
an interruption circuit configured to turn off the semiconductor switching element when both the overheat detection signal from the overheat detection circuit and the current detection signal from the current detection circuit are input.

* * * * *